United States Patent [19]

Nakao et al.

[11] Patent Number: 6,038,691

[45] Date of Patent: Mar. 14, 2000

[54] METHOD OF ANALYZING LOGIC CIRCUIT TEST POINTS, APPARATUS FOR ANALYZING LOGIC CIRCUIT TEST POINTS AND SEMICONDUCTOR INTEGRATED CIRCUIT WITH TEST POINTS

[75] Inventors: Michinobu Nakao, Hitachi; Kazumi Hatayama, Hitachinaka; Jun Hirano, Hadano, all of Japan

[73] Assignee: Hitachi, Ltd., Tokyo, Japan

[21] Appl. No.: 09/003,500

[22] Filed: Jan. 6, 1998

[30] Foreign Application Priority Data

Jan. 6, 1997 [JP] Japan .................................... 9-000363
Nov. 13, 1997 [JP] Japan .................................... 9-311738

[51] Int. Cl.⁷ .................................................. G01R 31/28
[52] U.S. Cl. ............................................................. 714/733
[58] Field of Search .................................... 714/733, 734, 714/724, 30; 324/158.1, 765

[56] References Cited

U.S. PATENT DOCUMENTS 5,450,414 9/1995 Lin .
5,737,340 4/1998 Tamarapalli et al. .................. 371/22.5

FOREIGN PATENT DOCUMENTS 0631235 12/1994 European Pat. Off. .
6-331709 12/1994 Japan .

OTHER PUBLICATIONS

R. Lisanke, et al., "Testability–Driven Random Test–Pattern Generation", IEEE Transactions on Computer Aided Design of Integrated Circuits and Systems, vol. CAD–6, No. 6, Nov. 1987, pp. 1082–1087.

M. Youssef, et al., Methodology for Efficiently Insterting and Condensing Test Points, IEE Proceedings–E Computers & Digital Techniques, vol. 140, No. 3, Part E, May 1993, pp. 154–160.

Seiss et al., "Test Point Insertion for Scan–Based BIST", Proceeding of 2nd European Test Conference, pp. 253–262 (1990).

Cheng et al., "Timing–Driven Test Point Insertion for Full–Scan and Partial–Scan BIST", Proceeding of Int'l Test Conference, pp. 506–514 (1995).

(List continued on next page.)

*Primary Examiner*—Albert De Cady
*Assistant Examiner*—Samuel Lin
*Attorney, Agent, or Firm*—Antonelli, Terry, Stout & Kraus, LLP

[57] ABSTRACT

A test point analyzing apparatus determines a distinction between capability and incapability of insertion of a test point and a circuit modifying way when a test point is capable of being inserted for each of the test point types to each of the signal lines in a semiconductor integrated circuit by using circuit information, a test point insertion library, and test point insertion. Then, test point indexes to test point candidates capable of being inserted are calculated, and test point candidates having a large testability are selected based on the indexes, and the selected test point candidates are registered in test point information. Such processing is repeated until a predetermined condition of completing the test point analysis process is realized. In the apparatus, a test point index calculation portion calculates test point index information including CRF (Cost Reduction Factor) of each signal line from circuit information, determines a predetermined number of test point candidates in order of the CRF, and calculates COP (Controllability Observability Procedure, hereinafter referred to as test cost) when each of the test point candidates is assumed to be inserted. By setting candidates of the minimum COP as test points, a test point determining portion searches the other test point candidates not intersecting with an effect region of the test points in increasing order, and if there exists a test point candidate not intersecting with an effect region, the test point is added to a new test point group.

21 Claims, 28 Drawing Sheets

OTHER PUBLICATIONS

Lisanke et al., "Testability–Driven Random Test–Pattern Generation", IEEE Transaction on Computer–Aided Design, vol. CAD–6, No. 6, Nov. 1987, pp. 1082–1087.

Chen el al., "Structural and Behavorial Synthesis for Testability Techniques", IEEE Transactions on Computer–Aided Design of Integrated Circuits and Systems, vol. 13, No. 6, Jun. 1994, pp. 777–785.

Uppaluri et al., "On Minimizing the Number of Test Points Needed to Achive Complete Robust Path Delay Fault Testability", Proceedings fo 14th VLSI Test Sympsium, pp. 288–295, Apr. 1996.

FIG.4A

| No | CELL NUMBER | PIN NUMBER | TEST POINT TYPE | CIRCUIT MODIFYING METHOD | PIN CONNECTING METHOD | | |
|---|---|---|---|---|---|---|---|
| 411   1 | INV1 | 2 | 1-CONTROL POINT | CHANGE TO CELL AND2 | 1<br>2<br>3 | ORIGINAL PIN 1<br>TO FF OUTPUT<br>ORIGINAL PIN 2 | |
| 412   2 | INV1 | 2 | 0-CONTROL POINT | CHANGE TO CELL NOR2 | 1<br>2<br>3 | ORIGINAL PIN 1<br>TO FF OUTPUT<br>ORIGINAL PIN 2 | |
| 413   3 | BUF1 | 2 | 0-CONTROL POINT | CHANGE TO CELL NOR2 | 1<br>2<br>3 | ORIGINAL PIN 1<br>TO FF OUTPUT<br>ORIGINAL PIN 2 | |
| 414   4 | HAND2 | 2 | 0-CONTROL POINT | CHANGE TO CELL ANDNOR | 1<br>2<br>3<br>4 | ORIGINAL PIN 1<br>ORIGINAL PIN 2<br>TO FF OUTPUT<br>ORIGINAL PIN 3 | |
| 415   1 | AND3 | 2 | 1-CONTROL POINT | INSERT CELL OR2 | 1<br>2<br>3 | ORIGINAL PIN 1<br>TO FF OUTPUT<br>TO OUTPUT DISTINATION BEFORE INSERTION | |
| 416   3 | AND3 | 2 | OBSERVATION POINT | BRANCH TO FF | — | | |
| 417   3 | OR3 | 2 | OBSERVATION POINT | BARNCH TO FF | — | | |

FIG.4B

| No | CELL NUMBER | PIN NUMBER | TEST POINT TYPE | CIRCUIT MODIFYING METHOD | PIN CONNECTING METHOD | | |
|---|---|---|---|---|---|---|---|
| 431   1 | INV1 | 2 | 1-CONTROL POINT | CHANGE TO CELL AND2 | 1<br>2<br>3 | ORIGINAL PIN 1<br>TO FF OUTPUT<br>ORIGINAL PIN 2 | |
| 432   2 | INV1 | 2 | 0-CONTROL POINT | CHANGE TO CELL NOR2 | 1<br>2<br>3 | ORIGINAL PIN 1<br>TO FF OUTPUT<br>ORIGINAL PIN 2 | |
| 433   3 | ALL CELL TYPES | OUTPUT PIN | OBSERVATION POINT | BRANCH TO FF | — | | |

FIG.6A

601 PROHIBITED PATH INFORMATION

| No | PATH START POINT | PATH END POINT | TEST POINT TYPE |
|---|---|---|---|
| 1 | TERMINAL 226 | TERMINAL 242 | CONTROL POINT |
| 2 | SIGNAL LINE 212 | SIGNAL LINE 215 | OBSERVATION POINT |
| 3 | CELL 251 PIN4 | CELL 252 PIN3 | CONTROL POINT |
| 4 | TERMINAL 236 | TERMINAL 226 | CONTROL POINT |

602 PROHIBITED BLOCK INFORMATION

| No | BLOCK NAME | TEST POINT TYPE |
|---|---|---|
| 1 | BLOCK 2000 | CONTROL POINT |
| 2 | BLOCK 2200 | CONTROL POINT |

FIG.6B

631 PROHIBITED PATH INFORMATION

| No | PATH START POINT | PATH END POINT | TEST POINT TYPE |
|---|---|---|---|
| 1 | TERMINAL 221 | TERMINAL 242 | CONTROL POINT |
| 2 | TERMINAL 222 | TERMINAL 242 | CONTROL POINT |
| 3 | TERMINAL 223 | TERMINAL 242 | CONTROL POINT |

632 PROHIBITED BLOCK INFORMATION

| No | BLOCK NAME | TEST POINT TYPE |
|---|---|---|

FIG.7A

| SIGNAL LINE | 0-CONTROL POINT | | 1-CONTROL POINT | | OBSERVATION POINT | |
|---|---|---|---|---|---|---|
| | CAPABILITY FLAG | LIBRARY NUMBER | CAPABILITY FLAG | LIBRARY NUMBER | CAPABILITY FLAG | LIBRARY NUMBER |
| 201 | X | — | ○ | 5 | ○ | 6 |
| 202 | X | — | X | — | X | — |
| 203 | X | — | ○ | 5 | ○ | 6 |
| 204 | X | — | X | — | X | — |
| 205 | X | — | X | — | X | — |
| 206 | X | — | X | — | X | — |
| 207 | ○ | 2 | ○ | 1 | X | — |
| 212 | ○ | 4 | X | — | X | — |
| 213 | X | — | X | — | ○ | 7 |
| 214 | X | — | X | — | X | — |
| 215 | X | — | X | — | X | — |
| 216 | X | — | X | — | X | — |

FIG.7B

| SIGNAL LINE | 0-CONTROL POINT | | 1-CONTROL POINT | | OBSERVATION POINT | |
|---|---|---|---|---|---|---|
| | CAPABILITY FLAG | LIBRARY NUMBER | CAPABILITY FLAG | LIBRARY NUMBER | CAPABILITY FLAG | LIBRARY NUMBER |
| 201 | X | — | X | — | ○ | 6 |
| 202 | X | — | X | — | X | — |
| 203 | X | — | ○ | 5 | ○ | 6 |
| 204 | X | — | X | — | X | — |
| 205 | X | — | X | — | X | — |
| 206 | X | — | X | — | X | — |
| 207 | ○ | 2 | ○ | 1 | X | — |
| 212 | X | — | X | — | X | — |
| 213 | X | — | X | — | ○ | 7 |
| 214 | X | — | X | — | X | — |
| 215 | X | — | X | — | X | — |
| 216 | X | — | X | — | X | — |

FIG.9A

| No | CANDIDATE FOR TEST POINT | | TEST POINT INDEX |
|---|---|---|---|
| | SIGNAL LINE | TEST POINT TYPE | |
| 1 | 207 | 1-CONTROL POINT | 871 |
| 2 | 203 | OBSERVATION POINT | 894 |
| 3 | 213 | OBSERVATION POINT | 1346 |
| 4 | 201 | OBSERVATION POINT | 1793 |
| 5 | 203 | 1-CONTROL POINT | 2866 |
| 6 | 207 | 0-CONTROL POINT | 3096 |

FIG.9B

| No | CANDIDATE FOR TEST POINT | | TEST POINT INDEX |
|---|---|---|---|
| | SIGNAL LINE | TEST POINT TYPE | |
| 1 | 213 | OBSERVATION POINT | 406 |
| 2 | 203 | OBSERVATION POINT | 809 |
| 3 | 201 | OBSERVATION POINT | 851 |
| 4 | 203 | 1-CONTROL POINT | 967 |

FIG.9C

| No | CANDIDATE FOR TEST POINT | | TEST POINT INDEX |
|---|---|---|---|
| | SIGNAL LINE | TEST POINT TYPE | |
| 1 | 203 | OBSERVATION POINT | 344 |
| 2 | 201 | OBSERVATION POINT | 390 |
| 3 | 203 | 1-CONTROL POINT | 502 |

| No | TEST POINT | | |
|---|---|---|---|
| | CELL NAME | PIN NUMBER | TEST POINT INSERTION LIBRARY NUMBER |
| 1 | 257 | 2 | 1 |
| 2 | 263 | 4 | 7 |
| 3 | 253 | 4 | 6 |

FIG.12

| No | PATH START POINT | PATH END POINT | DELAY MARGIN |
|---|---|---|---|
| 1 | TERMINAL 221 | TERMINAL 242 | 2 |
| 2 | TERMINAL 222 | TERMINAL 242 | 2 |
| 3 | TERMINAL 223 | TERMINAL 242 | 2 |
| 4 | TERMINAL 221 | TERMINAL 239 | 5 |
| 5 | TERMINAL 222 | TERMINAL 239 | 5 |
| 6 | TERMINAL 223 | TERMINAL 239 | 5 |
| 7 | TERMINAL 221 | TERMINAL 241 | 10 |
| 8 | TERMINAL 222 | TERMINAL 241 | 10 |
| 9 | TERMINAL 223 | TERMINAL 241 | 10 |

| No | PROHIBITED PATH INFORMATION | | |
|---|---|---|---|
| | PATH START POINT | PATH END POINT | TEST POINT TYPE |
| 1 | ALL INPUT TERMINALS AND ALL ELEMENTS CAPABLE OF BEING INPUT | SELECTOR, PIN2 | CONTROL POINT |
| 2 | ALL INPUT TERMINALS AND ALL ELEMENTS CAPABLE OF BEING INPUT | SELECTOR, PIN4 | CONTROL POINT |

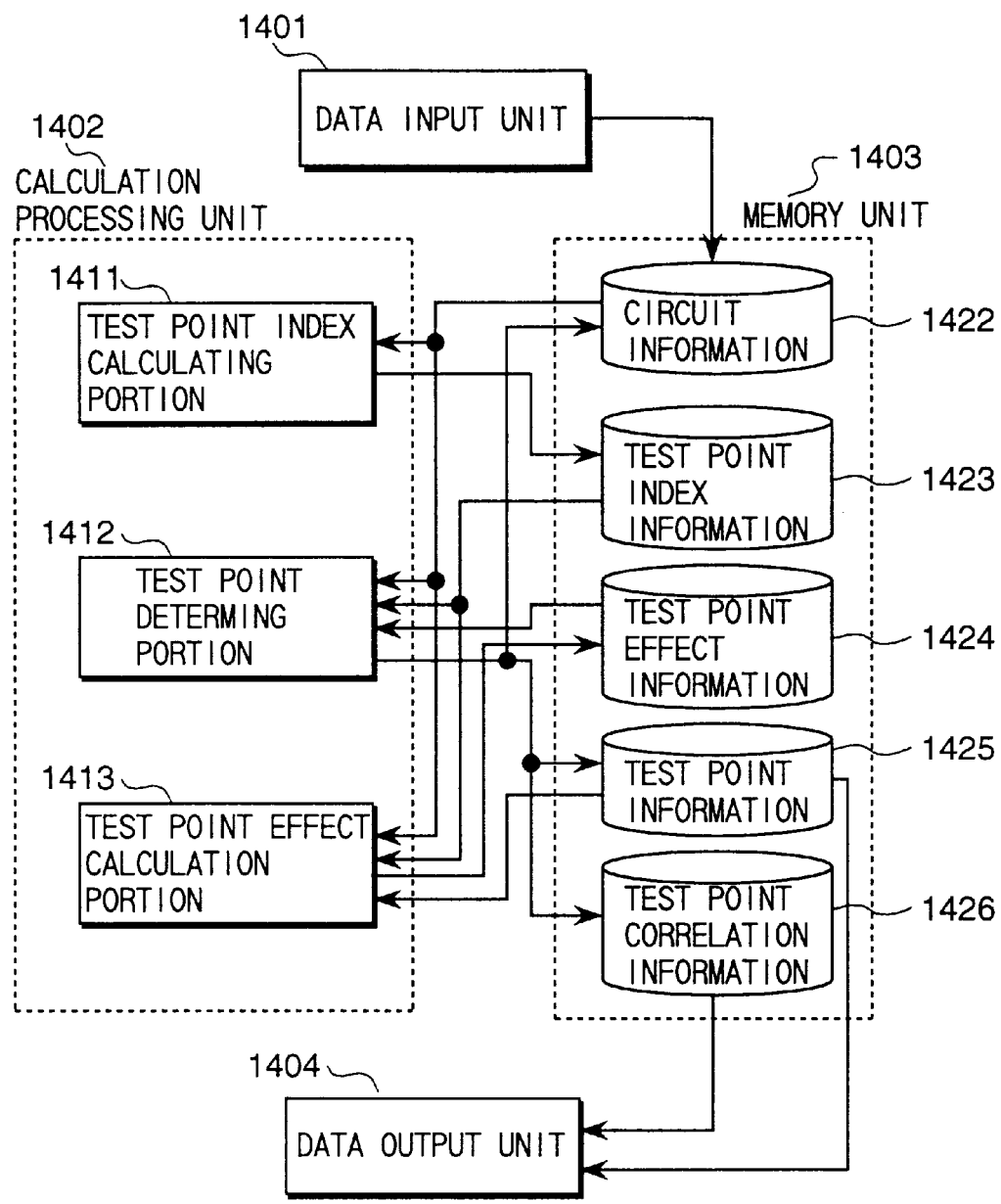

(NOTE 1) COP : SCALE OF PROBABILISTIC TESTABILITY
(CONTROLLABILITY, OBSERVABILITY, TEST COST)
(NOTE 2) CRF : APPROXIMATE VALUE OF TEST COST DIFFERENCE
BROUGHT BY INSERTION OF TEST POINT

FIG.23A

| SIGNAL NUMBER (2311) | C (2312) | O (2313) | P(0) (2314) | P(1) (2315) | dU/dO (2316) | dU/dC (2317) | CRFo (2318) | CRFc (2319) |
|---|---|---|---|---|---|---|---|---|
| 1601 | 0.1250 | 0.3535 | 0.0442 | 0.3093 | -73 | -177 | 17 | -34 |
| 1602 | 0.0313 | 0.5156 | 0.0161 | 0.4995 | -138 | -36795 | 34 | 952 |
| 1603 | 0.0078 | 0.1250 | 0.0010 | 0.1240 | -8274 | -131055 | 905 | -1056 |
| 1604 | 0.8750 | 0.9922 | 0.8682 | 0.1240 | -9 | 8400 | 0 | 798 |
| 1605 | 0.8760 | 1.0000 | 0.8760 | 0.1240 | -1053 | 64 | 0 | -12 |
| 1606 | 0.0156 | 1.0000 | 0.0156 | 0.9844 | -132 | -4095 | 0 | -68 |
| 1612 | 0.9375 | 0.5156 | 0.4834 | 0.0322 | -96 | 9191 | 24 | 441 |
| 1613 | 0.9844 | 0.1250 | 0.1230 | 0.0020 | -4173 | 32742 | 456 | -544 |
| 1614 | 0.1250 | 0.9844 | 0.1230 | 0.8613 | -9 | -4300 | 0 | 400 |
| 1615 | 0.1230 | 1.0000 | 0.1230 | 0.8770 | -540 | -65 | 0 | -12 |
| 1616 | 0.9688 | 1.0000 | 0.9688 | 0.0313 | -80 | 1023 | 0 | -36 |
| TEST COST (2320) | | | 1810 | | | | | |

FIG.23B

| SIGNAL NUMBER (2331) | C (2332) | O (2333) | P(0) (2334) | P(1) (2335) | dU/dO (2336) | dU/dC (2337) | CRFo (2338) | CRFc (2339) |
|---|---|---|---|---|---|---|---|---|
| 1601 | 0.1250 | 0.1851 | 0.0231 | 0.1619 | -267 | -399 | 40 | -66 |
| 1602 | 0.5156 | 0.5156 | 0.2659 | 0.2498 | -65 | -121 | 16 | 4 |
| 1603 | 0.1289 | 0.1250 | 0.0161 | 0.1089 | -578 | -460 | 63 | -97 |
| 1604 | 0.8750 | 0.8711 | 0.7622 | 0.1089 | -12 | 722 | 1 | 49 |
| 1605 | 0.8911 | 1.0000 | 0.8911 | 0.1089 | -93 | 83 | 0 | -13 |
| 1606 | 0.2578 | 1.0000 | 0.2578 | 0.7422 | -37 | -13 | 0 | -8 |
| 1612 | 0.4688 | 0.5156 | 0.2417 | 0.2739 | -131 | 109 | 33 | 2 |
| 1613 | 0.8672 | 0.1250 | 0.1084 | 0.0166 | -572 | 420 | 63 | -96 |
| 1614 | 0.1250 | 0.8672 | 0.1084 | 0.7588 | -12 | -717 | 1 | 49 |
| 1615 | 0.1084 | 1.0000 | 0.1084 | 0.8916 | -92 | -84 | 0 | -13 |
| 1616 | 0.7344 | 1.0000 | 0.7344 | 0.2656 | -69 | 12 | 0 | -8 |
| TEST COST (2340) | | | 414 | | | | | |

FIG.23C

| SIGNAL NUMBER (2351) | C (2352) | O (2353) | P(0) (2354) | P(1) (2355) |
|---|---|---|---|---|
| 1601 | 0.1250 | 0.2222 | 0.0278 | 0.1944 |
| 1602 | 0.5156 | 0.6250 | 0.3223 | 0.3027 |
| 1603 | 0.1289 | 1.0000 | 0.1289 | 0.8711 |
| 1604 | 0.8750 | 0.8711 | 0.7622 | 0.1089 |
| 1605 | 0.8911 | 1.0000 | 0.8911 | 0.1089 |
| 1606 | 0.2578 | 1.0000 | 0.2578 | 0.7422 |
| 1612 | 0.4688 | 0.6250 | 0.2930 | 0.3320 |
| 1613 | 0.8672 | 1.0000 | 0.8672 | 0.1328 |
| 1614 | 0.1250 | 0.8672 | 0.1084 | 0.7588 |
| 1615 | 0.1084 | 1.0000 | 0.1084 | 0.8916 |
| 1616 | 0.7344 | 1.0000 | 0.7344 | 0.2656 |
| TEST COST (2360) | | | 252 | |

FIG.24A

| No | TEST POINT CANDIDATE | | TEST POINT INDEX (TEST COST) | TEST POINT EFFECT(1) | TEST POINT EFFECT(2) | TEST POINT EFFECT(3) |
|---|---|---|---|---|---|---|
| | SIGNAL LINE | TEST POINT LINE | | | | |
| 1 | 1602 | 1-CONTROL POINT | 871 | ABSENCE | PRESENCE | PRESENCE |
| 2 | 1603 | OBSERVATION POINT | 894 | ABSENCE | PRESENCE | PRESENCE |
| 3 | 1604 | 0-CONTROL POINT | 1011 | ABSENCE | PRESENCE | PRESENCE |
| 4 | 1612 | 0-CONTROL POINT | 1345 | ABSENCE | ABSENCE | PRESENCE |
| 5 | 1613 | OBSERVATION POINT | 1346 | ABSENCE | ABSENCE | PRESENCE |

FIG.24B

| No | TEST POINT CANDIDATE | | TEST POINT INDEX (TEST COST) | TEST POINT EFFECT(1) | TEST POINT EFFECT(2) |
|---|---|---|---|---|---|
| | SIGNAL LINE | TEST POINT LINE | | | |
| 1 | 1603 | OBSERVATION POINT | 324 | ABSENCE | PRESENCE |
| 2 | 1613 | OBSERVATION POINT | 341 | ABSENCE | ABSENCE |
| 3 | 1604 | 0-CONTROL POINT | 354 | ABSENCE | ABSENCE |
| 4 | 1614 | 1-CONTROL POINT | 364 | ABSENCE | ABSENCE |
| 5 | 1601 | OBSERVATION POINT | 373 | ABSENCE | PRESENCE |

FIG.25A

| SIGNAL LINE (2501) | TEST POINT EFFECT(1) (2502) | TEST POINT EFFECT(2) (2503) | TEST POINT EFFECT(3) (2504) |
|---|---|---|---|
| 201 | ABSENCE | PRESENCE | PRESENCE |
| 202 | ABSENCE | PRESENCE | PRESENCE |
| 203 | ABSENCE | PRESENCE | PRESENCE |
| 204 | ABSENCE | PRESENCE | PRESENCE |
| 205 | ABSENCE | PRESENCE | PRESENCE |
| 206 | ABSENCE | PRESENCE | PRESENCE |
| 212 | ABSENCE | ABSENCE | PRESENCE |
| 213 | ABSENCE | ABSENCE | PRESENCE |
| 214 | ABSENCE | ABSENCE | PRESENCE |
| 215 | ABSENCE | ABSENCE | PRESENCE |
| 216 | ABSENCE | ABSENCE | PRESENCE |

FIG.25B

| SIGNAL LINE (2511) | TEST POINT EFFECT(1) (2512) | TEST POINT EFFECT(2) (2513) |
|---|---|---|
| 201 | ABSENCE | PRESENCE |
| 202 | ABSENCE | PRESENCE |
| 203 | ABSENCE | PRESENCE |
| 204 | ABSENCE | ABSENCE |
| 205 | ABSENCE | ABSENCE |
| 206 | ABSENCE | ABSENCE |
| 212 | ABSENCE | ABSENCE |
| 213 | ABSENCE | ABSENCE |
| 214 | ABSENCE | ABSENCE |
| 215 | ABSENCE | ABSENCE |
| 216 | ABSENCE | ABSENCE |

FIG.26A

| TEST POINT NUMBER | TEST POINT | | TEST POINT GROUP |
|---|---|---|---|
| | SIGNAL LINE | TEST POINT TYPE | |
| 1 | 1602 | 1-CONTROL POINT | 1 |
| 2 | 1612 | 0-CONTROL POINT | 1 |

FIG.26B

| TEST POINT NUMBER | TEST POINT | | TEST POINT GROUP |
|---|---|---|---|
| | SIGNAL LINE | TEST POINT TYPE | |
| 1 | 1602 | 1-CONTROL POINT | 1 |
| 2 | 1612 | 2-CONTROL POINT | 1 |
| 3 | 1603 | OBSERVATION POINT | 1 |
| 4 | 1613 | OBSERVATION POINT | 1 |

METHOD OF ANALYZING LOGIC CIRCUIT TEST POINTS, APPARATUS FOR ANALYZING LOGIC CIRCUIT TEST POINTS AND SEMICONDUCTOR INTEGRATED CIRCUIT WITH TEST POINTS

BACKGROUND OF THE INVENTION

The present invention relates to an analysis method and an analysis apparatus for arranging test points in an optimum manner in order to make it easy to test a logic circuit composed of a plurality of elements, and also relates to a semiconductor integrated circuit having an improved arrangement of test points.

One of technologies for easily testing a semiconductor integrated circuit involves a method where test points are inserted in the circuit. The test points are classified into a "1 control point" for improving the ease in controlling a signal line to 1 (hereinafter referred to as "1 controllability"), a "0control point" for improving the ease in controlling a signal line to 0 (hereinafter referred to as "0 controllability ") and an "observation point" for improving the ease in observing a signal value of a signal line (hereinafter referred to as "observability").

A circuit having test points and a method of analyzing positions for inserting the test points are described in detail in an article entitled "Test Points Insertion for Scan-Based BIST" by B. Seiss et al. in Proceeding of 2nd European Test Conference , pages 253 to 262 (1990), or in Japanese Patent Application Laid-Open No. 6-331709 entitled "Circuit improved in testability and method of improving testability of circuit".

Particularly, the method of analyzing test points as described in the former B. Seiss et al reference defines an objective function (hereinafter, referred to as "test cost") using a probabilistic testability scale, referred to as a so-called COP controllability observability procedure), and determines test points one by one so as to minimize the objective function. That is, the procedure to determine one test point comprises the steps of selecting candidates for a test point (hereinafter, referred to as "test point candidates") based on an approximation value of the test cost when the test point candidate is inserted, calculating an actual test cost when each of the test point candidates is inserted, and then determining a test point candidate which minimizes the test cost as a test point. This process is repeated for the number of a test points. It has been confirmed that this analysis method is effective for simplifying a random number pattern test.

Further, a method of analyzing test points which improves the above method by B. Seiss et al. so as to suppress degradation in a signal delay due to test point insertion is described in an article entitled "Timing-Driven Test Point Insertion for Full-Scan Partial-Scan BIST" by K. -T. Cheng et al. in Proceeding of International Test Conference, pages 506 to 514 (1995). In the procedure for obtaining one test point in the above method by B. Seiss et al., the Cheng et al method calculates a margin of signal delay in each signal line of a circuit, and requires a condition of the test point candidate that the margin of signal delay be larger than a predetermined value. The other processes are the same as those in the method of B. Seiss et al. Therein, the margin of signal delay in a path between terminals or elements refers to a value obtained by subtracting an actual signal delay from an allowable design signal delay. The margin of signal delay in each signal line is a minimum margin of signal delay in a path containing it.

Among the above-mentioned conventional methods of analyzing test points, the method of B. Seiss et al. has a problem in that the performance of a semiconductor integrated circuit is degraded by degradation of a signal delay due to test point insertion. On the other hand, in the method of Cheng et al, since it is required to calculate margins of signal delay for individual signal lines every time one test point is selected, due to a bottleneck in this process there is a problem in that the processing cannot be completed within a practical time for a large scale logic circuit.

Further, as a method of actually forming a test point in a semiconductor integrated circuit, it is common to insert a 2-input OR gate when a 1-control point is formed, and to insert a 2-input AND gate when a 0-control point is inserted. However, in this case, most of the semiconductor integrated circuits after, inserting a test point, are circuits having problems which should be optimized from the viewpoint of the overhead of the signal delay and the circuit area.

The methods of analyzing test points as described above have a problem in their practical use since the processing time is very long when a large scale logic circuit is analyzed. Most of the processing time is spent in test cost calculation of test point candidates in which the loop-nest becomes deepest. Assuming that the number of test point candidates and the number of test points are proportional to the number of gates, the test cost calculation time is proportional to the number of gates in a worst case, and the processing time for the total test point analysis is proportional to the third power of the gate number. On the other hand, from the viewpoint of the trend toward producing semiconductor integrated circuits of larger scale and the trend toward improving the processing speed of computers, it is preferable that the practical processing time is proportional to the second or less power of the gate number.

Further, a problem of inserting the test point in a semiconductor integrated circuit concerns occurrence of overhead in a circuit area, the main cause of which is in input elements solely used for a test point and flip-flops with a scan function used as output element.

SUMMARY OF THE INVENTION

In view of the above-mentioned problems, the first object of the present invention is to provide a method and an apparatus for fast analyzing test points in a semiconductor integrated circuit in which the overheads of the signal delay and the circuit area due to insertion of the test points are reduced, and which can operate at a high speed and be easily usable.

The first object of the present invention can be attained by providing a method of analyzing semiconductor integrated circuit test points for determining test point insertion positions and ways of modifying a semiconductor integrated circuit formed by connecting a plurality of cells with signal lines so as to improve the testability, the method comprising the steps of preparing a test point insertion library which lists sets of a cell type capable of being inserted as a test point, a pin number, a test point type and a circuit modifying way for the plurality of cells and signal lines in order to specify a test point type capable of being inserted and a circuit modifying way when the test point can be inserted to a signal line specified by the cell type and the pin number of the semiconductor integrated circuit, and determining test point insertion positions and circuit modifying ways by selecting signal lines and test point types only from the signal lines and the test point types corresponding to the cell type names and the pin numbers specified by the test point insertion library.

Further, the first object of the present invention can be attained by providing a method of analyzing semiconductor integrated circuit test points for determining test point insertion positions and circuit modifying ways, the method comprising the steps of preparing test point insertion prohibiting information which specifies sets of a signal line and a test point type prohibiting test point insertion in the semiconductor integrated circuit, and determining test point insertion positions and circuit modifying ways excluding sets of a signal line and a test point type specified by the test point insertion prohibiting information from test point candidates.

Furthermore, the first object of the present invention can be efficiently attained by providing a method of analyzing semiconductor integrated circuit test points for determining test point insertion positions and circuit modifying ways, the method comprising the steps of preparing a test point insertion library and test point insertion prohibiting information, and determining test point insertion positions and circuit modifying ways by selecting signal lines and test point types only from the signal lines and the test point types of the circuit corresponding to the cell type names and pin numbers which are specified by the test point insertion library and are not included as signal lines and test point types in the circuit specified by the test point insertion prohibiting information.

An apparatus for analyzing semiconductor integrated circuit test points to which the method in accordance with the present invention is applied, the apparatus comprising a test point insertion position limiting portion for determining a distinction between the capability and incapability of insertion of a test point for each of the test point types for each of the signal lines by using test point insertion prohibiting information which specifies sets of a signal line and a test point type which prohibits test point insertion, circuit information of the semiconductor integrated circuit and the test point insertion library, and for obtaining test point insertion position information including a circuit modifying way when a test point is capable of being inserted, in order to specify a test point type capable of being inserted and a circuit modifying way corresponding to the test point when the test point can be inserted to a signal line specified by the cell type name and the pin number of the semiconductor integrated circuit, a test point index calculation portion for calculating an index expressing a degree of testability for a signal line capable of being inserted with a test point and the test point type, assuming that the test point is inserted; and a test point determining portion for determining a signal line and the test point type having a large index expressing a degree of testability, as a test point from among the sets of a signal line capable of being inserted with a test point and a test point type applied to the signal line.

In view of the above-mentioned problem problems, the second object of the present invention is to provide a method and an apparatus for fast analyzing insertion positions of test points in a logic circuit.

The third object of the present invention is to provide a semiconductor integrated circuit in which the overhead of the test point circuits to be inserted is reduced.

The fourth object of the present invention is to provide a method of analyzing test point correlation information which is necessary to reduce an area overhead resulting from test point insertion.

The second object of the present invention is attained by providing a method of analyzing logic circuit test points which determines positions for inserting test points and circuit types by calculating a test cost when the test points are inserted in respective signal lines of a logic circuit formed by connecting a plurality of elements, the method comprising the steps of selecting a preset number of test point candidates in decreasing order of degree of testability obtained by calculating a test cost or an approximation value of a test cost for each of the signal lines in the logic circuit, obtaining an effect region in which the testability varies when it is assumed that each of the test point candidates is inserted, and setting a group of candidates in the test point candidates, of which the effect regions do not overlap each other, or overlap each other with a negligible effect, as a new test point group of which the test points are simultaneously testable.

Further, the second object is attained by obtaining an effect region in which the testability varies when it is assumed that each of test point candidates is inserted, the test point candidates being determined by selecting a preset number of test points in decreasing order of degree of testability, based on the test cost obtained for each of the signal lines, and setting a group of candidates in the test point candidates, which are not included in effect regions of other groups in the test point candidates, as a new test point group of which the test points are simultaneously testable, by examining an effect region of each test point candidate in turn in the decreasing order of degree of testability.

Further, the second object is attained by obtaining a test cost (for example, COP), or an approximation value of a test cost (for example, CRF) for each of the signal lines in the logic circuit under the condition of absence or presence of inserting a test point for the signal line, selecting a preset number of test point candidates in decreasing order of CRF, obtaining a test cost when it is assumed that each of the test point candidates is inserted, determining presence or absence of an effect of each set test point to test costs of the other test point candidates when each of the test point candidates is set as a test point in turn in increasing order of test cost, setting a test point candidate of which the effect on test costs of the other test point candidate does not exist or is negligible as a new test point group, calculating effects of the set test point to the other test point candidates, and repeating the above processing steps.

Further, the second object is attained, in the above-mentioned method, by recalculating CRFs for the logic circuit including test points which were already set if a predetermined completion condition is not satisfied when the setting process of the new test point group is executed over all of the preset number of test point candidates, based on the presence or absence of effects of the test point, further resetting a necessary number of test point candidates in decreasing order of CRF, and repeating the above-mentioned setting process of a new test point group considering the effects of each of the re-set test point candidates.

Further, the second object is attained by setting candidates in the test point candidates, which do not receive an effect of the set test points and of which the test costs satisfy a predetermined threshold.

Further, the second object is attained by providing an apparatus for analyzing logic circuit test points according to the above-mentioned methods, the apparatus comprising a test point index calculation portion for obtaining a test cost or an approximation value of a test cost for each of the signal lines in the logic circuit under the condition of non-execution or execution of inserting a test point for the signal line, and selecting a preset number of test point candidates in decreasing order of degree of testability determined, based on an obtained test cost or an obtained approximation value of a test cost for each of the signal lines in the logic circuit, a test point effect calculation portion for calculating whether the testability of each of the other test point candidates is affected by a test point set just before, and a test point determining portion for repeating a process of setting a test point candidate having a highest degree of testability as a test point and a process of setting a test point candidate not having the effect between the test point candidate and the set test point as a next test point.

Further, the second object is attained by providing an apparatus for analyzing logic circuit test points according to the above-mentioned apparatus, wherein the test point determining portion outputs test point correlation information for identifying test points, having effect regions, a degree of testability for each the signal lines in each of the effect regions varying by setting a test point in the effect region, which do not intersect each other, as in the same group.

The third object of the present invention is attained by providing a semiconductor integrated circuit composed by inserting control points in a plurality of signal lines having relatively small test costs into a logic circuit formed by connecting a plurality of elements, wherein a test data input signal line of each of the control points, having effect regions, a degree of testability for each of signal lines in each of the effect regions varying by setting a control point in the effect region, which do not intersect each other, is connected to a predetermined element, and the element is connected to any one of an external input element, a flip-flop with a scan function and a test data input signal line so as to be able to set a signal value.

The fourth object of the present invention is attained by providing a method of analyzing correlation information of test points in a logic circuit having a plurality of pre-set test points, the method comprising a first step of temporarily determining all test points to which a test point group is not set yet as test point candidates, based on circuit information including insertion positions of the test points, types of circuits and test costs, and determining a test point candidate having a minimum test cost as a test point, a second step of calculating an effect region in which a test cost of each of the signal lines varies by inserting the determined test point, and repeating a process of checking each of the test point candidates arranged in increasing order of test cost for whether or not it is included in the effect region, a process of determining a test point candidate which is not included in the effect region as a new test point, and a process of adding correlation information of the same group to the test point candidate determined as the new test point, and a third step of returning the processing to the first step if a predetermined number of test points cannot be determined as a new test point when the second step is performed over all of the test point candidates.

BRIEF DESCRIPTION OF THE DRAWINGS

FIGS. 4A and 4B are tables showing examples of a test point insertion library.

FIGS. 6A and 6B are tables showing examples for test point insertion prohibiting information.

FIGS. 7A and 7B are tables showing examples for test point insertion position information.

FIGS. 9A and 9B and 9C are tables showing transient contents in processing test point index information.

FIG. 12 is a table showing margins of signal delay to corresponding paths.

FIG. 14 is a block diagram showing the composition of an embodiment of an apparatus for analyzing logic circuit test points in accordance with the present invention.

FIGS. 23A–23C rare tables showing the calculation contents of COP, differential coefficients and CRF.

FIGS. 24A and 24B are tables showing test point index information and the composition of test point effect information to test point candidates, and the transition contents in the processing process.

FIGS. 25A and 25B are tables showing test point effect information and transition contents in the processing.

FIGS. 26A and 26B are tables showing the composition and contents of test point information and test point correlation information.

DETAILED DESCRIPTION OF THE EMBODIMENTS

Embodiments of the present invention will be described in detail below, with reference to the accompanying drawings.

Figure 1:
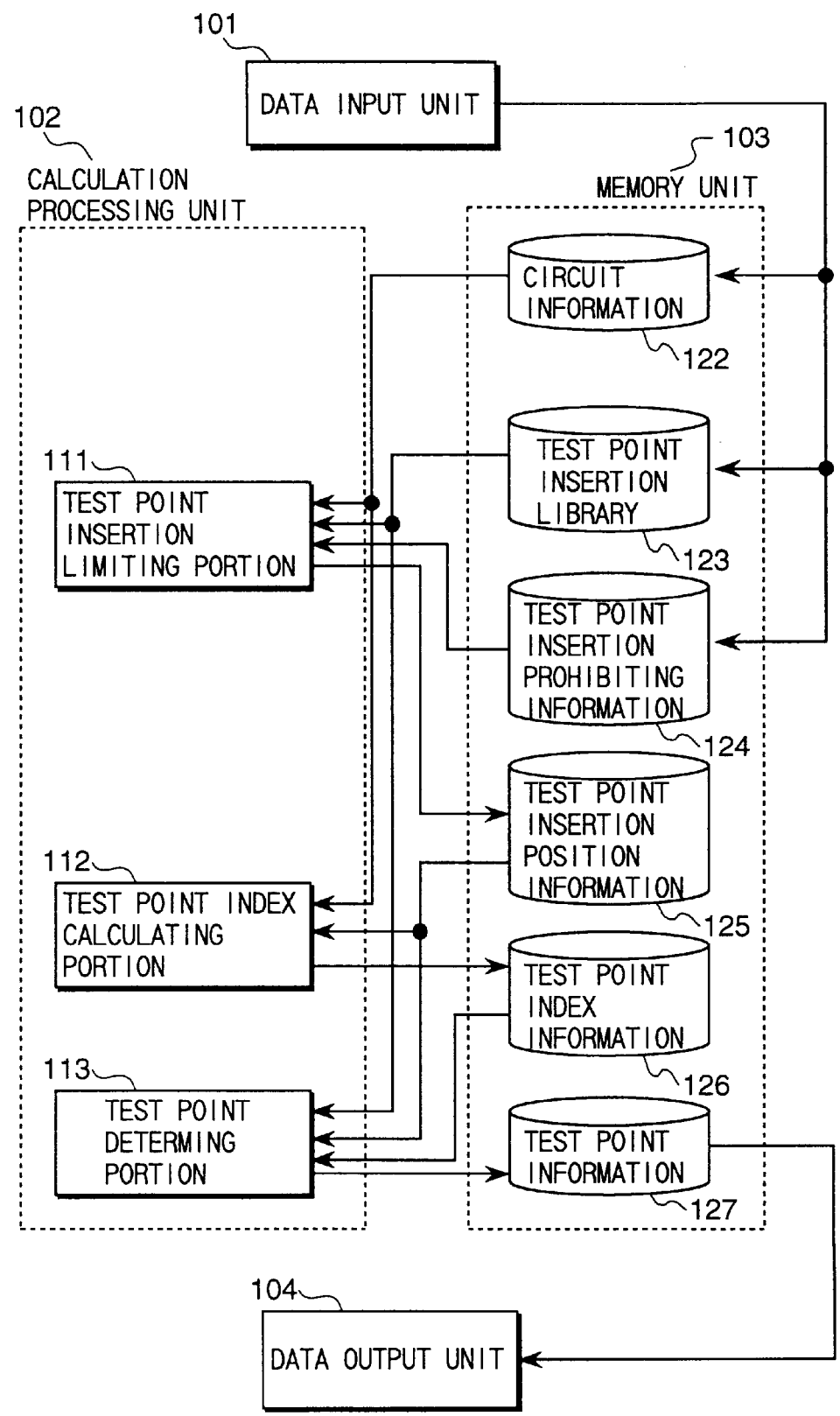
FIG. 1 is a block diagram showing the construction of an embodiment of an apparatus for analyzing test points of a semiconductor integrated circuit in accordance with the present invention.

FIG. 1 shows the construction of an embodiment of an apparatus for analyzing test points of a semiconductor integrated circuit. The analyzing apparatus comprises a data input unit 101 for inputting information on cells and signal lines of the semiconductor integrated circuit; a calculation processing unit 102 for performing a calculation, such as determination of insertion positions of test points; a memory unit 103 for storing circuit information 122, including a test point insertion library 123, test point insertion prohibiting information 124, test point insertion position information 125, test point index information 126 and test point correlation information 127; and a data output unit 104 for outputting calculated results, such as the test point information 127.

The circuit information 122 includes information on signal lines extending between the cells in the semiconductor integrated circuit, and information on assumed failures. As information on the cells in the semiconductor integrated circuit, a cell name of inherent names for each cell, a sell type name expressing the kind of cell, a pin name and a name of a signal line connected to the pin are given. The cell in the semiconductor integrated circuit depends on the manufacturing technology of the semiconductor integrated circuit, but a logic circuit has a logically equivalent function depending on the type. Thereby, the semiconductor integrated circuit is modeled as a logic circuit in the process calculating the test point index information in the present embodiment.

The test point insertion library 123 is for specifying a test point type capable of being inserted and a circuit modifying method when the test point is capable of being inserted to a specified signal line by a cell and the pin number in the semiconductor integrated circuit, and is information listing sets of a cell type name capable of being inserted and the pin number and the test point type and the circuit modifying method.

The test point insertion prohibiting information is information listing sets of signal lines in which insertion of a test point is prohibited. The signal line is expressed by the starting point or the end point of a path, and the starting point or the end point of the path is expressed by a set of a signal line name, a terminal name or a cell position and a pin number. The test point types are "1 control point", "0 control point" and "observation point".

The test point insertion position information 125 is information linking discrimination of capability and incapability of test point insertion with a circuit modifying method when the test point is capable of being inserted for each test point in the semiconductor integrated circuit.

The test point index information 126 is numerical information on a test point candidate reflecting total circuit testability when the test point candidate is inserted, and the information 126 is expressed by a table of the test point indexes corresponding to the test point candidates. Each test point candidate is expressed by a set consisting of the signal line and the test point type.

The test point information 127 is information on insertion positions of the test points and the circuit modifying methods, and is expressed by a set consisting of a signal line (specified by a cell name and a pin number) and a circuit modifying method described in the test point insertion library 123.

The calculation processing unit 102 is composed of a test point insertion position limiting calculation portion 111 for calculating the test point insertion position information from the circuit information 122, the test point insertion library 123 and the test point insertion prohibiting information 124; a test point index calculation portion 112 for calculating the test point index information using the circuit information and the test point insertion position information 125; and a test point determining portion 113 for calculating the test points and the test point information 127 from the test point index information 126.

Figure 2:
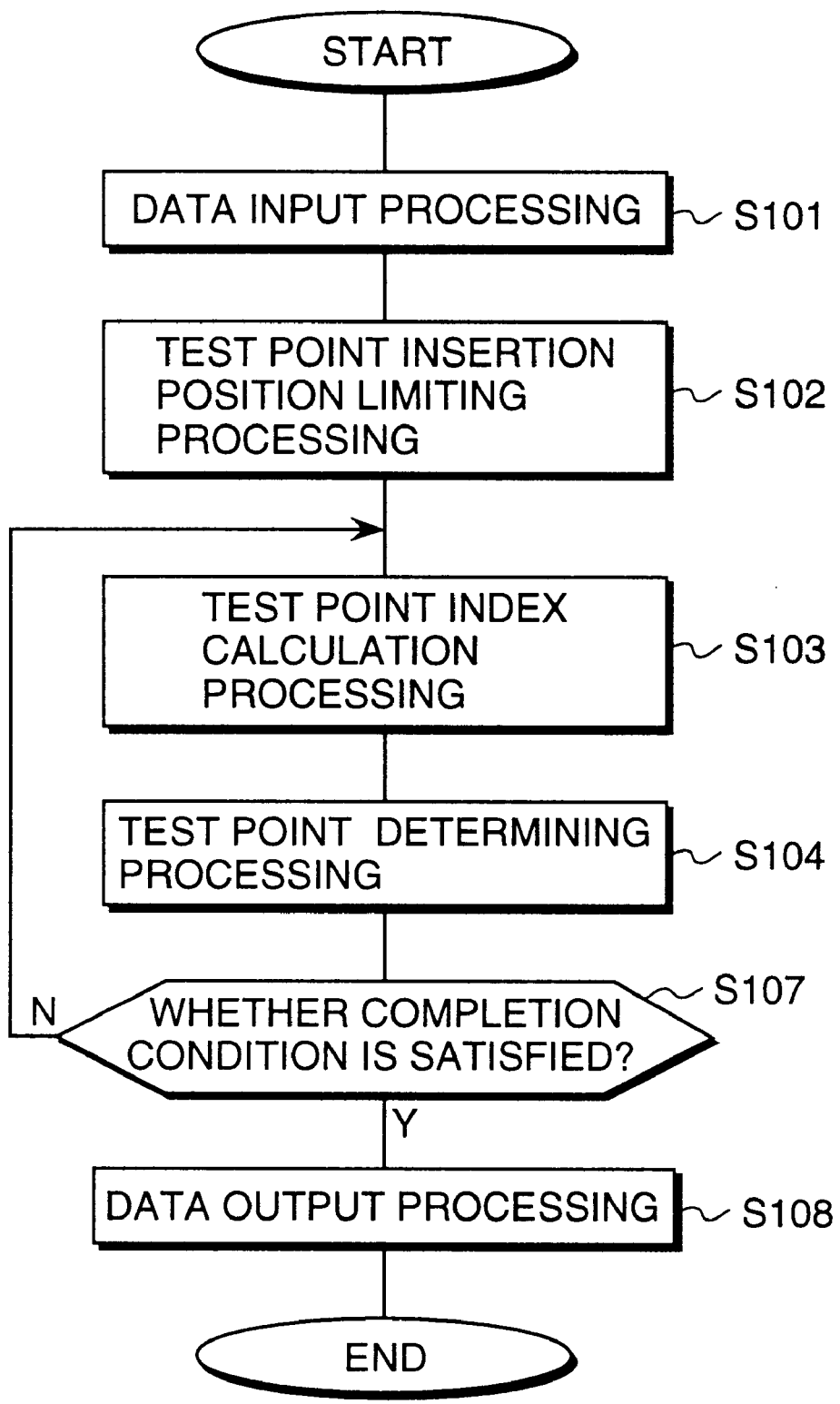
FIG. 2 is a flow-chart showing an embodiment of a process carried out by the apparatus for analyzing test points of a semiconductor integrated circuit.

FIG. 2 is a flow-chart showing an embodiment of a process performed by the apparatus for analyzing test points of a semiconductor integrated circuit.

Step S101 is data input processing in which the circuit information 122, the test point insertion library 123 and the test point insertion prohibiting information 124 are input and stored in the memory unit 103 using the data input unit 101.

Step S102 is test point insertion position limiting processing performed by the test point insertion position limiting unit 111 in which the test point insertion position limiting information 125 is formed by calculating a distinction between capability and incapability of insertion of a test point for each of the test point types to each of the signal lines in the circuit from the circuit information 122, the test point insertion library 123 and the test point insertion prohibiting information 124.

Step S103 is test point index calculation processing preformed by the test point index calculation portion 112 in which the test point index information 126 is formed by calculating a test point index to a test point candidate from the test point insertion position information 125.

Step S104 is test point determining processing performed by the test point index calculation portion 112 in which a test point candidate having the highest testability is selected based on the test point index information 126 and the test point candidate is registered in the test point information 127.

In Step S107, it is judged whether a pre-determined completion condition of the test point analysis processing has been satisfied. If the completion condition is not satisfied, the processing is returned to Step S103 and the test point index calculation processing of the semiconductor integrated circuit is executed including the test points which have been determined. Then, the test point determining process for determining a new test point based on the test point indexes to test point candidates, except for the test points which have been determined, and the test point index calculation processing and the test point determining processing are executed, and the above-mentioned processing is repeated as long as the completion condition is not satisfied. The completion condition is determined, for example, by an upper limit the number of test points, a threshold value of the test point index, a limit of the processing time and so on.

When the completion condition is satisfied in Step S107, the processing proceeds to Step S108 and the test point information 127 stored in the memory unit 103 is output by the data output unit 104 as the results of the output apparatus for analyzing semiconductor integrated circuit test points.

Each of the information and each step of the processing will be described in detail below, referring to an example of a semiconductor integrated circuit.

Figure 3A:
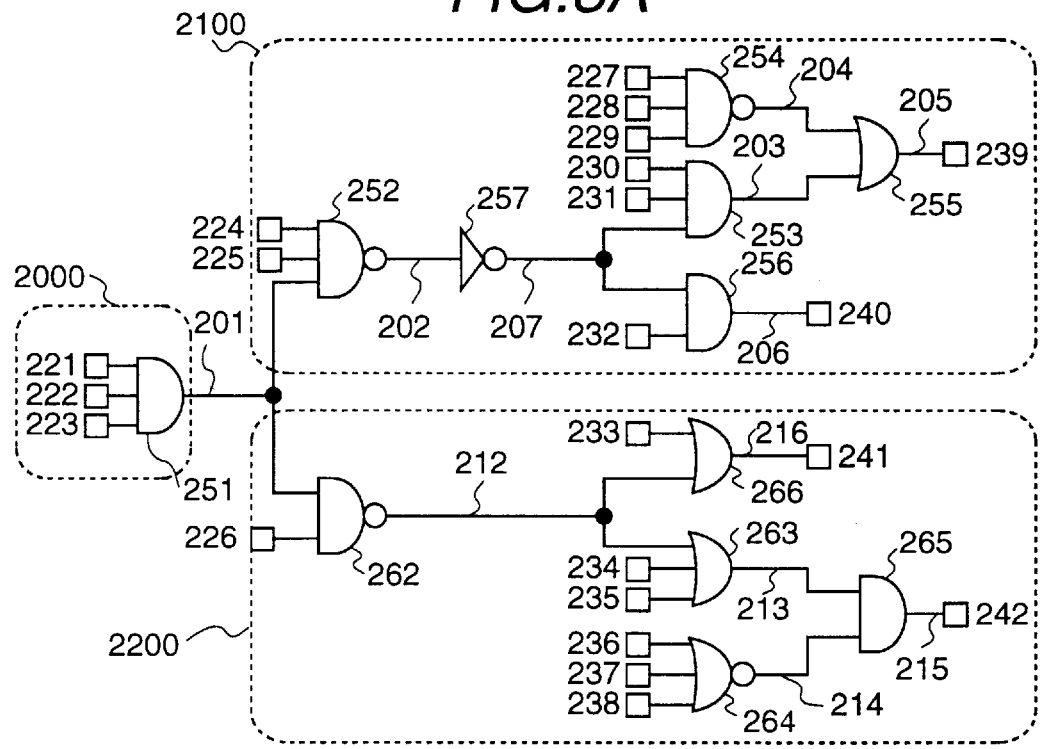
FIGS. 3A and 3B show examples of a semiconductor integrated circuit diagram and the semiconductor integrated circuit diagram to which test points are inserted, respectively.
Figure 3B:
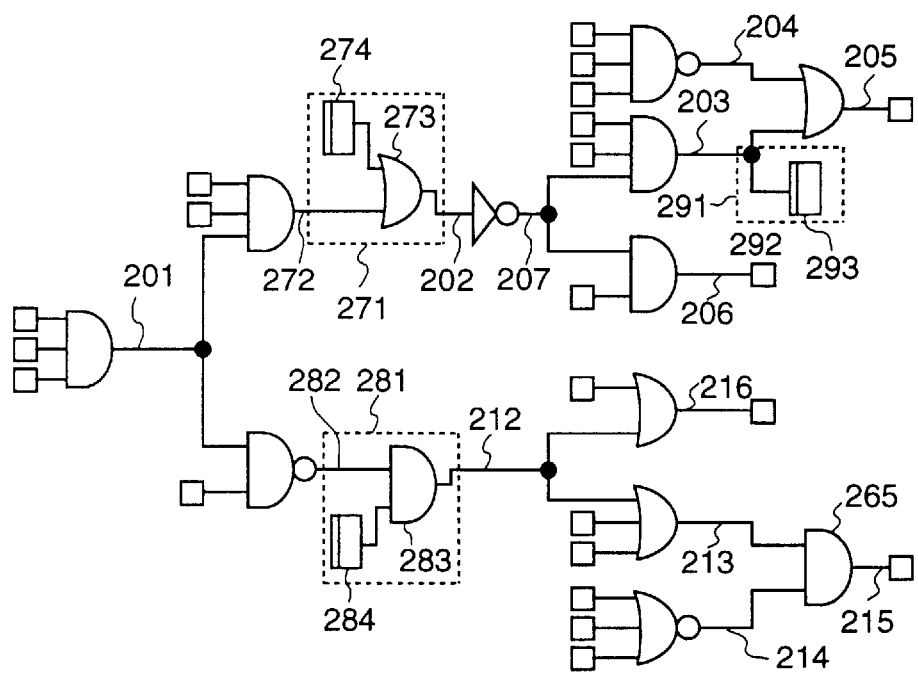

FIGS. 3A and 3B are circuit diagrams showing examples of a semiconductor integrated circuit and a recomposed semiconductor integrated circuit to which test points are inserted in the former semiconductor integrated circuit, respectively. FIG. 3A shows the example of the semiconductor integrated circuit before inserting the test points which perform a logical operation equivalent to a logic circuit composed of INV gate, AND gates, OR gates, NAND gates, NOR gates, input terminals and output terminals, and one gate corresponds to one cell. The cell type names for the cells are, for example AND3, NAND3, AND3, NAND3, OR2, AND2, INV1, NAND2, OR3, NOR3, AND2 and OR2 in order of the cells 251 to 257, 262 to 266. In regard to the pin numbers for the cells the, pin number of the input pin is increased in order from the upper side of the figure to the lower side, as 1, 2, . . . , and pin number of the output pin is set as (the number of the input pins+1). For example, in the cell 251, the pin numbers of the input pins connected to the terminals 221, 222 and 223 are 1, 2 and 3, respectively, and the number of the pin connected to the signal line 201 is 4. Further, as for a failure group, failures of output lines, that is, the signal lines 201 to 206 and signal lines 212 to 216 degenerating to signal value 0 (0-degenerating failures), and failures the output lines degenerating to signal value 1 (1-degenerating failures) are assumed.

Further, this example of the semiconductor integrated circuit is associated with block information which is information of the sub-circuit grouping of a plurality of cells and signal lines. The block 2000 is a sub-circuit including the cell 251, the block 2100 is a sub-circuit including the cells 252 to 257, and the block 2200 is a sub-circuit including the cells 262 to 266. In designing a semiconductor integrated circuit, information on blocks is generally used in a case where designing is performed stepwise from blocks having a small function to a block having a more complex function using the blocks having a small function.

FIG. 3B shows an example of a circuit where three test points are inserted into the circuit of FIG. 3A according to a conventional test point insertion method (the method described in the aforementioned reference of B. Seiss et al.). A 1-control point 271 is inserted to the signal line 202, a 0-control point 281 is inserted to the signal line 212, an observation point 291 is inserted to the signal line 203.

The control point 271 improves the 1-controllability of the signal line 202. The control point 271 is composed of a 2-input OR gate 273 and a flip-flop with scan function 274, and input lines of the cell 273 are connected to an input side portion 272 of the signal line 202 and to the flip-flop with scan function 274. An output line of the cell 273 is connected to the signal line 202. The flip-flop with scan function 254 outputs a signal value input by a scan chain at testing, but always outputs the signal 0 during normal operation.

The 0-control point 281 improves the 0-controllability of the signal line 212. The control point 281 is composed of a 2-input AND gate 283 and a flip-flop with scan function 284, and input lines of the cell 283 are connected to an input side portion 282 of the signal line 212 and a test data input line connected to the flip-flop with scan function 284. An output line of the cell 283 is connected to the signal line 212. The flip-flop with scan function 264 outputs a signal value input by a scan chain at testing, but always outputs the signal 1 during normal operation.

The observation point 291 improves the observability of the signal line 203. A flip-flop with scan function 293 is connected to the signal line 292 branched from the signal line 203.

Figure 5:
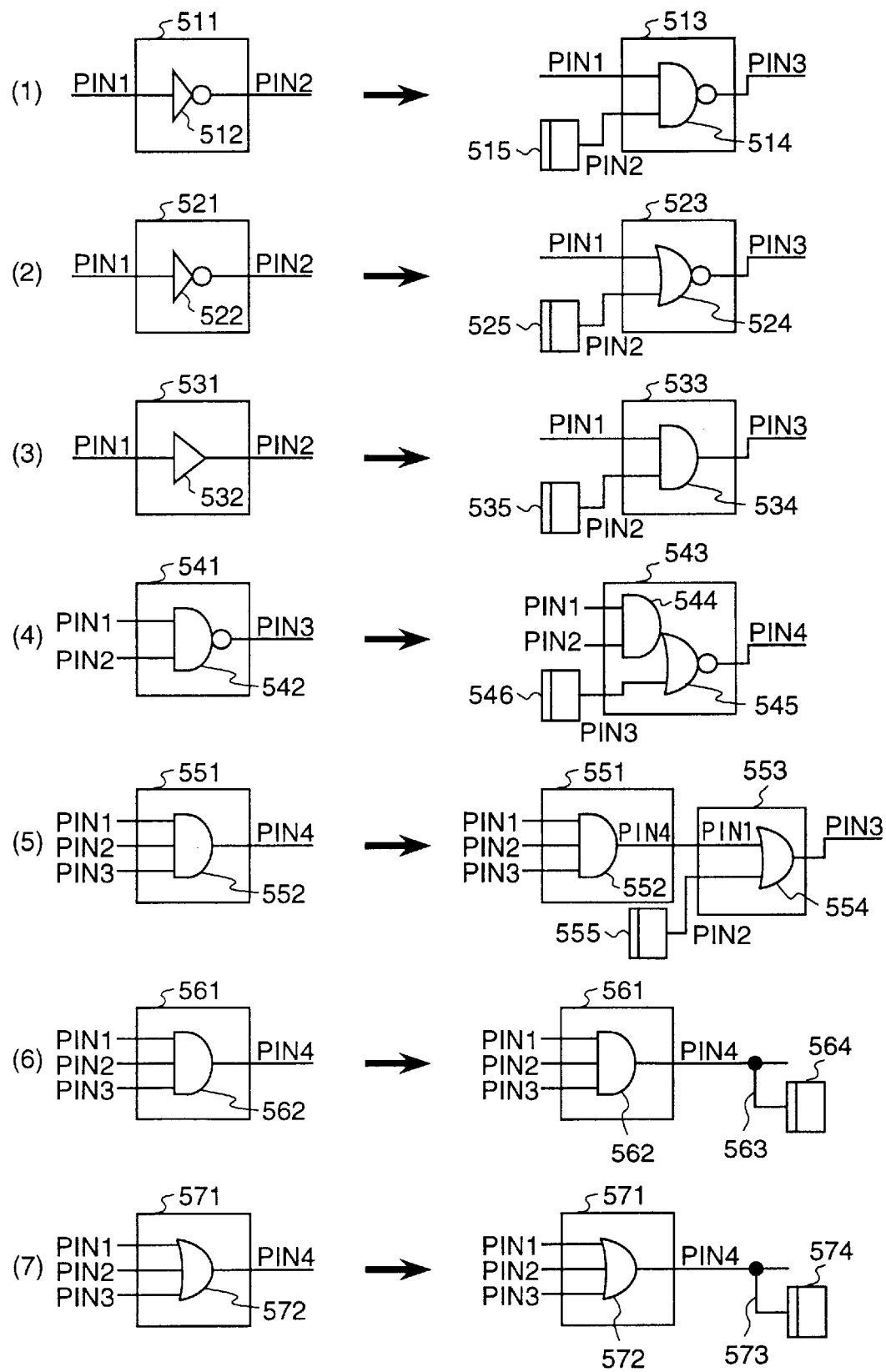
FIG. 5 is a logic diagram table for explaining respective circuit modifying ways for inserting a test point to each of cells of various types.

The test point insertion library 123 will be described below, referring to FIG. 4(a) and FIG. 5.

FIG. 4A is an example of a test point insertion library 123. In the figure, the column 401 indicates the number of each element of the test point insertion library, and the columns 402, 403 indicate a cell name and a pin number to specify a signal line capable of inserting a test point. The column 404 indicates a test point type expressing the purpose of inserting a test point, and the column 405 indicates an actual circuit modifying method. In the circuit modifying method, information of the column 406 determining a connection method to each pin is described so as to be unique.

The rows 411 to 417 indicate each element of the test point library which is a set consisting of a cell type name capable of inserting a test point, a pin number, a test point type and a circuit modifying method. Diagrams (1) to (7) shown in FIG. 5 show circuit modifying methods corresponding to respective cell types 411 to 417 shown in FIG. 4A.

Numeral 1 of the test point insertion library (the row 411) expresses that a 1-control point of a signal line connected to pin 2 of cell type INV1 is capable of being inserted and the circuit modifying method is to change the cell INV1 to a cell NAND2. That is, as shown by the diagram (1) in FIG. 5, the cell 511 having an INV gate function is replaced by a cell 513 having a NAND gate function, and the pins 1 and 3 correspond to the pins 1 and 2 of the cell 511 before the replacement, respectively, and the pin 2 is connected to the signal line of an output pin of a flip-flop 515 with a scan function.

Numeral 2 of the test point insertion library (the row 412) expresses that a 0-control point of a signal line connected to pin 2 of cell type INV1 is capable of being inserted and the circuit modifying method is to change the cell INV1 to a cell NOR2. That is, as shown by the diagram (2) in FIG. 5, the cell 521 having an INV gate function is replaced by a cell 523 having a NOR gate function, and the pins 1 and 3 correspond to the pins 1 and 2 of the cell 521 before the replacement, respectively, and the pin 2 is connected to the signal line of an output pin of a flip-flop 525 with a scan function.

Numeral 3 of the test point insertion library (the row 413) expresses that a 0-control point of a signal line connected to pin 1 of cell type BUF1 is capable of being inserted and the circuit modifying method is to change the cell BUF1 to a cell AND 2. That is, as shown by the diagram (3) in FIG. 5, the cell 531 having a BUF gate function is replaced by a cell 533 having an AND gate function, and the pins 1 and 3 correspond to the pins 1 and 2 of the cell 531 before the replacement, respectively, and the pin 2 is connected to the signal line of an output pin of a flip-flop 535 with a scan function.

Numeral 4 of the test point insertion library (the row 414) expresses that a 0-control point of a signal line connected to pin 3 of cell type NAND2 is capable of being inserted and the circuit modifying method is to change the cell NAND2 to a cell ANDOR. That is, as shown by the diagram (4) in FIG. 5, the cell 541 having a NAND gate function is replaced by a cell 543 having a AND gate function and a NOR gate function, and the pins 1, 2 and 4 correspond to the pins 1, 2 and 3 of the cell 531 before the replacement, respectively, and the pin 3 is connected to the signal line of an output pin of a flip-flop 546 with a scan function.

Numeral 5 of the test point insertion library (the row 415) expresses that a 1-control point of a signal line connected to pin 1 of cell type AND3 is capable of being inserted and the circuit modifying method is to insert a cell OR2. That is, as shown by the diagram (5) in FIG. 5, a cell 553 having an OR gate function is inserted into a signal line connected to the pin 4 of the cell 551 having an AND gate function, and the pins 1 and 3 correspond to the signal lines of the input side and the output side, and the pin 2 is connected to the signal line of an output pin of a flip-flop 555 with a scan function.

Numeral 6 of the test point insertion library (the row 416) expresses that an observation point of a signal line connected to pin 4 of cell type AND3 is capable of being inserted and the circuit modifying method is to branch the signal line to connect to a flip-flop with a scan function. That is, as shown by the diagram in FIG. 5, a signal line 563 is branched from the signal line connected to the pin 4 of the cell 561 having an AND gate function to connect to a data input pin of the flip-flop 564 having a scan function.

Numeral 7 of the test point insertion library (the row 417) expresses that an observation point of a signal line connected to pin 4 of cell type OR3 is capable of being inserted and the circuit modifying method is to branch the signal line to connect to a flip-flop with a scan function. That is, as shown by the diagram (7) in FIG. 5, a signal line 573 is branched from the signal line connected to the pin 4 of the cell 571 having an OR gate function to connect to a data input pin of the flip-flop 574 having a scan function.

The test point insertion prohibiting information 124 will be described below, with reference to FIG. 6A.

FIG. 6A is an example of the test point insertion prohibiting information. In this example, the test point insertion prohibiting information is composed of prohibited path information 601 expressing signal lines in which insertion of a test point is prohibited and prohibited block information 602 expressing blocks in which insertion of a test point is prohibited. Contents of the rows 615 to 618 and 624 to 625 are examples relavent to the semiconductor integrated circuit of FIG. 3A.

The prohibited path information 601 is composed of a number 611, a path starting point of a path in which it is prohibited to insert a test point 612 and the path end point 613, and a prohibited test point type 614. For example, the row 615 indicates that insertion of a control point (1-control point and 0-control point) to insert to a signal line on a path from the terminal 226 to the terminal 242 is prohibited, that is in, the signal line connected to the terminal 226 and the signal lines 212, 213 and 215. Similarly, the row 616 indicates that insertion of an observation point to a signal line on a path from the signal line 212 to the signal line 215 is prohibited, that is in, the signal lines 212, 213 and 215. The row 617 indicates that insertion of a control point to a signal line on a path from a pin 4 of the cell 251 to a pin 3 of the cell 252 is prohibited, that is in, the signal line 201. The row 618 indicates that insertion of a control point to a signal line on a path from the terminal 236 to the signal line 214 is prohibited, that is in, the signal line connected to the terminal 236 and the signal line 214. As shown in the rows 615 to 618, the path start point and the path end point may be expressed by any set capable of specifying both ends of a path, such as by a terminal name, a signal line name, a cell name or a pin number.

The prohibited block information 602 is composed of a number 621 a, block name 622 of a block in which it is prohibited to insert a test point and prohibited test point type 623. For example, the row 624 indicates that insertion of a control point into signal lines included in a block 2000 is prohibited, that is in, the signal lines connected to the terminals 221 to 223 and the signal line 201. Similarly, the row 625 indicates that insertion of a control point is into signal lines included in a block 2200 is prohibited, that is in, the signal lines connected to the terminals 226, 233 to 238 and the signal lines 212 to 216.

Figures 13A, 13B:
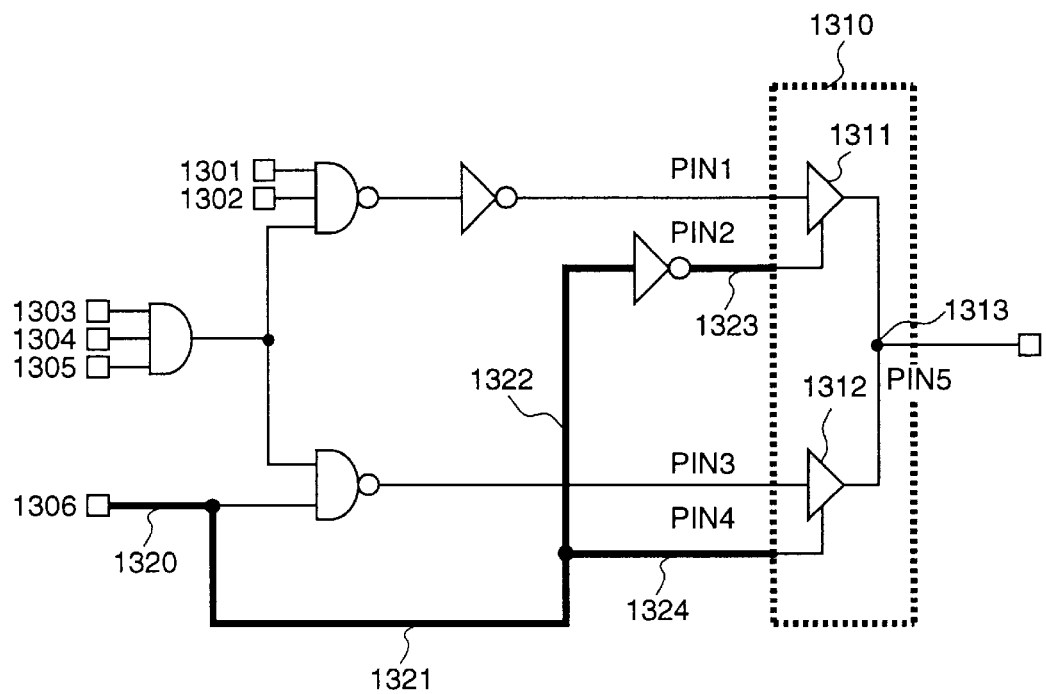
FIGS. 13A and 13B are circuit block diagram explaining prohibition paths which prohibit test point insertion and a table describing information on the prohibition paths, respectively.

FIGS. 13A and 13B show another embodiment for designating test point insertion prohibiting information. FIG. 13A shows an example of a semiconductor integrated circuit in which the reference characters 1301 to 1306 indicate input terminals, and a cell 1310 has a cell type called a "selector" and five pins. FIG. 13B shows prohibited path information 1331 for the circuit. The configuration of the prohibited path information 1331 is the same as that of the prohibited path information 601, but the specifying method of the start point and the end point is different. For example, in the row 1345, the start point of the path is all input terminals and all elements capable of being input, which means the input terminals 1301 to 1306, and the end point means the pin 2 of the cell type name "selector", that is, the resultant specified path is the signal lines 1320, 1321, 1322 and 1323. Similarly, the path specified by the row 1346 is the lines 1320, 1321 and 1324. Since the test point types in both rows are control points, a control point on the two paths is prohibited.

For reference, an application in which such a specifying method may be used is where a built-in self-test (BIST) method is employed in the inspection of a semiconductor integrated circuit, and a cell outputting an undefined value (undefined whether the value is 0 or 1) is used. An example of such a cell is the selector 1310 described above, in which the output becomes an undefined value (depends on the construction of the cell) when the input values to the pin 2 and the pin 4 are (0, 0) or (1, 1). Since the circuit before insertion of a test point is constructed so as to avoid such an input condition, insertion of a control point to the input side of the pin 2 and the pin 4 are prohibited in order to maintain the state of the circuit.

The test point insertion position information 125 will be described below, with reference to FIG. 7A and FIG. 7B.

FIG. 7A is an example of the test point insertion position information. The test point insertion position information is composed of a signal line designation 701, 0-point information to the signal line 702, 1-point information to the signal line 705 and observation point information 708. The information for each test point to the signal lines is in the form of capability flags (703, 706. 709) expressing a distinction between being capable or incapable of inserting a test point, and library numbers (704, 707, 710) expressing circuit modifying methods when the test point is capable of being inserted. In the figure, the capability flag is expressed by "O" when a test point is capable of being inserted, and by "X" when a test point is incapable of being inserted. The library number expresses an element of the test point insertion library, and indicates a corresponding circuit modifying method of the test point insertion library. The information in the figure is an example relevant to the semiconductor integrated circuit of FIG. 3A, and the test point insertion library is assumed to be that shown in FIG. 4A. For example, the row for the signal line 201 of FIG. 7A indicates that a 0-control point is incapable of being inserted into the signal line 201, a 1-control point is capable of being inserted into the signal line 201 and the circuit modification is performed by inserting a cell OR2 as shown in column 5 of the row 415 of FIG. 4A when the 1-control point is inserted, and an observation point is capable of being inserted into the signal line 201 and the circuit modification is performed by branching to a flip-flop with a scan function as shown in column 6 of the row 416 of FIG. 4A when the observation point is inserted.

A description will be sequentially presented below on a processing procedure for each portion of the calculation processing apparatus executed in each of the steps of FIG. 2.

Figure 8:
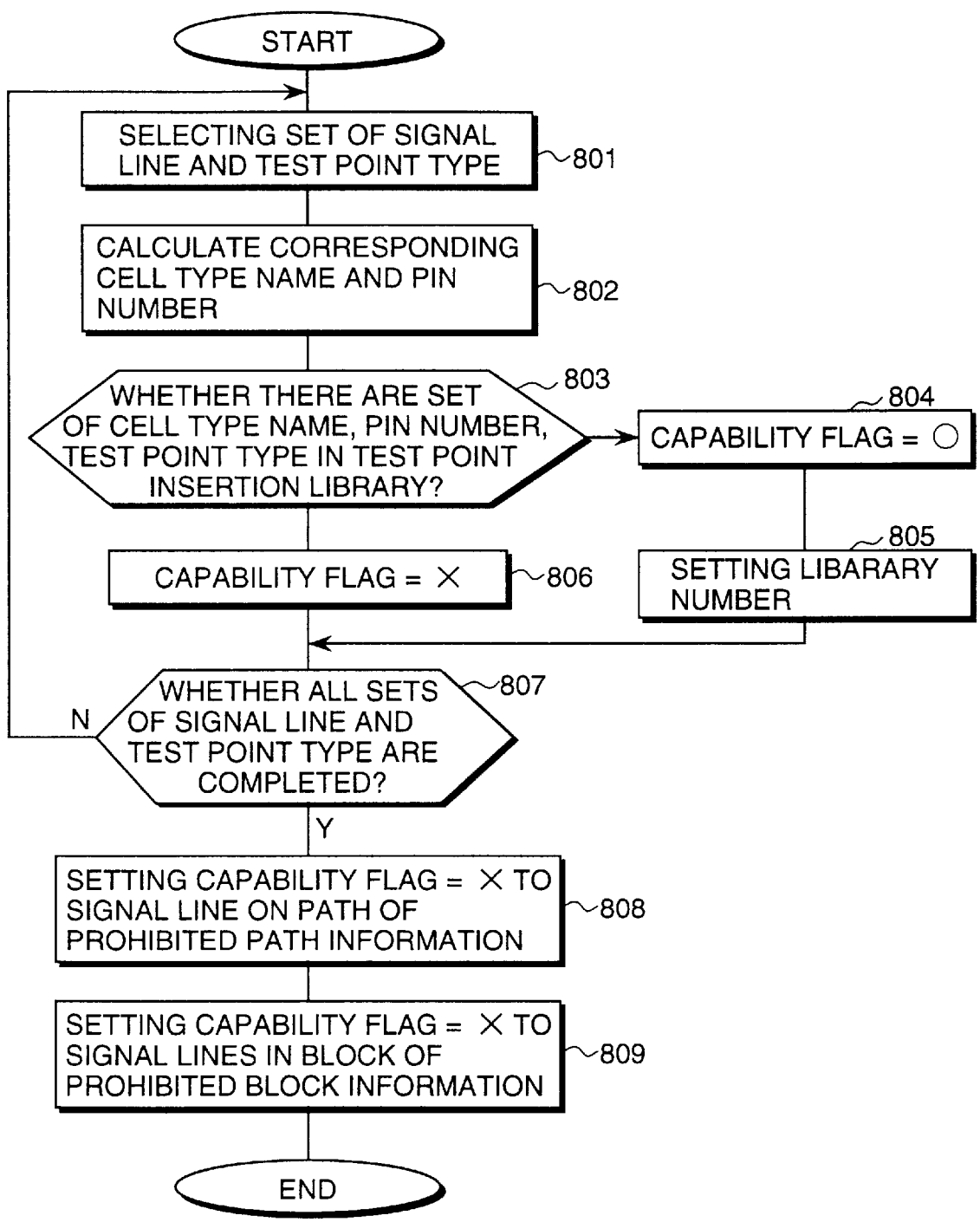
FIG. 8 is a flow-chart showing a processing procedure of the test point insertion position limiting process in FIG. 2.

FIG. 8 is a flow-chart showing a processing procedure of the test point insertion position limiting process. This process is performed in the test point insertion position limiting portion 111, and the test point insertion position information 125 is formed using the test point insertion library 123 and the test point insertion prohibiting information 124. A description will be presented using the example of the test point insertion library shown in FIG. 4A, the example of the test point insertion prohibiting information shown in FIGS. 6A and 6B, and the example of the test point position information shown in FIGS. 7A and 7B.

In Step 801, a signal line in a semiconductor integrated circuit is selected, and a test point type, such as a 0-control point, a 1-control point or an observation point, is selected for the signal line. In Step 802, to a cell and pins corresponding to the selected signal line, a cell type name of the cell and pin numbers of the pins are calculated. Therein, the signal line described here is assumed to have a one-to-one correspondence with a set consisting of a cell and pins. In Step 803, retrieval is performed to confirm whether or not there is an element (a set consisting of cell type name, pin number, test point type, circuit modifying method) agreeing with the cell type name, the pin number, the test point type. If there is such an element, the processing proceeds to Step 804 to set the capability flag to "O" expressing a capability of inserting the test point to the corresponding signal line and the test point type of the test point insertion position information. Then, in Step 805, the element number of the element in the test point insertion library is set to the library number so that the circuit modifying method can be identified. If it is found that there is no such element in the test point insertion library in Step 803, the processing proceeds to Step 806 to set the capability flag to "X" expressing prohibition of inserting the test point to the corresponding test point type. In Step 807, it is judged whether or not the processes of the above Steps 801 to 806 are completed for all the signal lines. If the processes are not completed, the processing is returned Step 801 to perform the processes of Steps 802 to 806 by selecting a set consisting of a signal line and a test point type which have not been processed yet. If the processes are completed, the processing proceeds to Step 808 capability flag is set to. In Step 808, the mark "X" expressing prohibition of test point insertion to a specified test point type for the signal line on the path specified by the prohibited path information of the test point insertion prohibiting information. In Step 809 the capability flag is set to, the mark "X" expressing prohibition of test point insertion to a specified test point type for the signal lines in a block specified by the prohibited block information of the test point insertion prohibiting information.

The above-mentioned test point position limiting process is for a case where there exist both the test point insertion library and the test point insertion prohibiting information. In a case where the test point insertion prohibiting information is not provided and only the test point insertion library is prepared, it is possible to omit the process of Steps 808 to 809 in the flow of FIG. 8, which is a process concerning the test point insertion prohibiting information. Accordingly, it is sufficient that the process after S103 in the total flow of FIG. 2 is continued using the test point position information formed in Steps 801 to 807.

On the other hand, in a case where the test point insertion library is not provided and only the test point insertion prohibiting information is prepared, the library number is meaningless and the test point position information becomes only the capability flag expressing a distinction between capability and prohibition of test point insertion. In the test point insertion position limiting process, the mark "O" expressing capability of test point insertion is set to the capability flags for all the signal lines and all the test points, and the processes of Steps 808 to 809 are performed to form the test point position information.

The process procedure of the test point index calculation portion 112 performed in the test point index calculation process of Step S103 will be described below. Initially, a set consisting of a signal line and a test point type having a capability flag "O" expressing a capability of test point insertion is selected from the test point insertion position information 125. To the consisting set of the signal line and the test point type, calculation is performed on an index (test point index) expressing a degree of testability assuming that the test point is inserted. This process is performed for all the sets of a signal line and a test point type which have the capability flag "O" expressing capability of test point insertion.

This processing is executed by the test point index calculation portion 111, which calculates a scale of probabilistic testability referred to as COP and described above as a test point index. However, the invention is not limited to the COP, but any index can be used so long as the index produces an effect of improving the testability.

Here, a calculating method of a COP will be described. Calculation of the COP is performed by calculating controllability (1-controllability) from the input side toward the output side and calculating observability from the output side toward the input side. In this way a failure detecting probability is calculated. The failure detecting probability is a product of a probability that a signal line having a failure, from each of various assumed failures, has a signal value at failure which is different from a signal value in a normal state and a probability that the signal line failure can be detected. That is, a failure detecting probability of a 0-degenerating failure is a product of 1-controllability and an observability, and a failure detecting probability of a 1-degenerating failure is a product of 0-controllability and an observability. Therein, "0-controllability=1−1-controllability". Further, The objective function of the test cost is defined as a value obtained by adding the reciprocal of the failure detecting probability to all failures. This is a value equivalent to an expected value of number of a test patterns for detecting one failure, and since it reflects testability of a whole circuit, the testability becomes higher as the cost is smaller.

Although it is indicated in the above description that the processing to calculate the test point index is performed for all signal lines and all test point types capable of having a test point inserted therein, the processing needs a long time. An efficient method of calculating the test point index to avoid the problem is described in the reference of B. Seiss et al. The method will be described below.

Initially, a COP before insertion of a test point is calculated. Then, a differential coefficient of test cost in regard to observability and a differential coefficient of test cost in regard to controllability are calculated for each of the signal lines. The details of such a calculation method are described in an article entitled "Testability-Driven Random Test-Pattern Generation" by R. Lisanke, et al. IEEE Transactions on Computer-Aided Design Vol. CAD-6 pages 1082–1087 (1987). So-called CRFs (Cost Reduction Factors) are calculated for all sets of signal lines and test point type capable of having a test point inserted therein. The CRF is an approximate value of test cost difference resulting from insertion of a test point, that is, an approximate value of subtracting a test cost of inserting a test point from a test cost before inserting the test point. The details of the calculation method of CRF is described in the above-mentioned reference of B. Seiss, and it is preferable to insert a test point in a signal line having a larger value of the CRF. However, since the CRF is an approximate value, it is required to calculate a test cost in a case where a test point is actually inserted. Test point candidates satisfying a condition are selected based on the CRF, and a group of the test point candidates is formed. The condition of the CRF for the test point candidates is an upper limit of the number of test points pre-determined in decreasing the order of the CRF, or a certain ratio to the maximum value of the CRF. Finally, the COPs (controllability, observability, test cost) in a case of inserting the test point candidates are calculated for all elements of the group of the test point candidates. Using the result, test point index information 126, which is a group of sets each consisting of a test point candidate and a test cost, is produced.

In regard to the test point index calculation process S103, the process is not limited to the above-mentioned process. It is possible to employ any process producing test point index information in which test point indexes to test point candidates having a large value of testability are calculated.

The process of the test point determining portion 113 performing the test point determining process in Step S104 will be described below. In the test point index information 126, which is information listing sets consisting of a test point candidate and the test point index, a test point having the largest test point index judging from the test point index is determined as a test point, and the signal line name and the test point type are registered in the test point information 127. That is, in a case of using the test cost based on the above-mentioned COP as the test point index, a test point candidate having a minimum test cost is determined as a test point.

The construction of the apparatus for analyzing test points of a semiconductor integrated circuit and the processing procedure in accordance with the present invention have been described. A description will be provided below in detail concerning the operation when the present invention is applied to the semiconductor integrated circuit of FIG. 3A, referring to the process chart of FIG. 2. The description will be made with reference to the example of the test point insertion library 123 shown in FIG. 4A and the example of the test point insertion prohibiting information 124 shown in FIG. 6A, and the completion condition in Step S107 in the process flow is that the number of newly determined test points is three.

Initially, in Step S101, the information of FIG. 3A is input as the circuit information 122. As for assumed failures, failures of output lines, that is, 0-degenerating failures and 1-degenerating failures on the signal lines 201 to 206 and signal lines 212 to 216 are assumed. A signal line capable of having a control point and an observation point inserted therein are assumed to be an output line of each element, that is, the signal lines 201 to 207 and 212 to 216.

Next, in the test point insertion position limiting process of Step S102, in Steps 801 to 807, the test point insertion position information is formed from the circuit information and the test point insertion library. FIG. 7A shows the test point insertion position information at the time when the judgment of Step 807 is "Y".

In a case where the signal line 201 and 0-control point are selected in Step 801, the cell type name AND3 and the pin number 4 corresponding to the signal line 201 are calculated in Step 802. In Step 803, the test point insertion library number of AND3, pin number 4, 0-control point is searched for but not found. Therefore, the processing proceeds to Step 806, and the mark "X" is set to the capability flag. Returning to Step 801, in a case of selecting the signal line 201 and 1-control point, in Step 803, the test point insertion library number of AND3, pin number 4, 1-control point is searched for and the test point insertion library number 5 (the row 415) can be found. In Step 804, the mark "O" is set to the capability flag, and the library number 5 is set in Step 805. Further, returning to Step 801, in a case of selecting the signal line 201 and observation point, in Step 803, the test point insertion library number of AND3, pin number 4, and observation point is searched for and the test point insertion library number 6 (the row 416) can be found. In Step 804, the mark "O" is set to the capability flag, and the library number 6 is set in Step 805.

Similarly, a combination of the signal lines 202 to 216, nd 0-control point, 1-control point, and observation point is successively selected and the above processing is performed. Sets consisting of the signal line and the test point type capable of inserting a test point are a 1-control point and an observation point of the signal line 203 corresponding to the cell type name AND3 and pin number 4, a 0-control point and a 1-control point of the signal line 207 corresponding to the cell type name INV1 and pin number 2, a 0-control point of the signal line 212 corresponding to the cell type name NAND2 and pin number 3, and an observation point of the signal line 213 corresponding to the cell type name OR3 and pin number 4. To these points, the mark "O" is set to the capability flag in Step 804, and the library number is set in Step 805. The other sets consisting of the signal line and the test point type are prohibited from having a test point inserted therein and the mark "X" is set to the capability flag.

In Step 807, if it is judged that the setting of the capability flag and the library number for all the signal lines and all the test point types is completed, the process for the test point insertion prohibiting information 124 of FIG. 6A is performed. FIG. 7A shows the test point insertion position information at the time when Step 809 is completed.

In Step 808, to the signal lines on the path from the terminal 226 to the terminal 242 described in the prohibited path information 631, that is, the signal lines 212, 213 and 215, insertion of a control point (0-control point, 1-control point) is prohibited. Although in the test point position information of FIG. 7A for insertion of a 0-control point for the signal line 212, it is described that inserting a test point is possible, the mark "X" expressing prohibiting of test point insertion is set to the flag by this process.

In Step 809, to the signal lines in the block 2000, that is, the signal line 201, insertion of a control point (0-control point, 1-control point) is prohibited. Although in the test point position information of FIG. 7A for insertion of a 1-control point to the signal line 201, it is described that inserting a test point is possible, the mark "X" expressing prohibiting of test point insertion is set to the flag by this process.

In the test point index calculation processing of Step S103, to the sets consisting of a signal line and a test point type capable of having a test point inserting therein, as provided in the test point insertion position information 125, that is, to the test point candidates, the test point index information 126 is formed by calculating a test point index. The test point index is a test cost based on the above-mentioned COP. FIG. 9A is test point index information formed during a process for determining a first test point, and the test point index (test cost) 905 corresponding to a test point candidate 902 of a set consisting of the signal line 903 and the test point type 904 is expressed by the table.

Figures 10, 11:
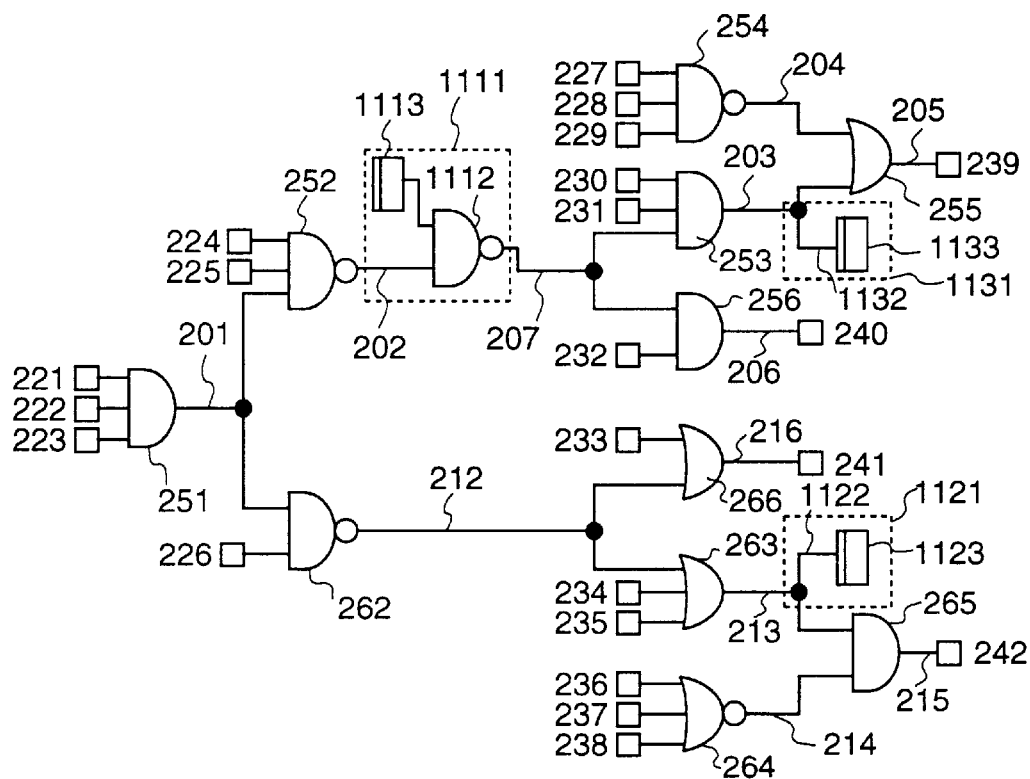
FIG. 10 is a table showing an example of test point information.
FIG. 11 is a circuit diagram showing an embodiment of a semiconductor integrated circuit in which test points are inserted in accordance with the present invention.

In the test point determining processing of Step S104, a test point candidate having the highest testability, that is, having the smallest test cost judging from the test point index in the test point index information 126 shown in FIG. 9A, is determined as a test point candidate of a 1-control point of the signal line 207 as the test point and is registered in the test point information 127. FIG. 10 is an example of the test point information which is composed of a set consisting of a cell name 1003 and a pin number 1004, and test point insertion library number 1005 indicating a circuit modifying method. The 1-control point of the signal line 207 determined previously is registered in the row 1011 as test point number 1, and pin number 2 of the cell 257 corresponding to the signal line 207 is set, and the library number is set to 1 (one) referring to the library number to the 1-control point of the signal line 207 in the test point insertion position information shown in FIG. 7B.

In Step S107, since the condition of the number of test points=3 set previously is not satisfied, the processing is returned to Step S103 and a process for determining a second test point is started. In Step S103, based on the circuit to which the test point number 1 is inserted, a test point candidate and a test cost in the case of the circuit having the test point 1 are calculated. FIG. 9B shows the test point index information formed during processing to determine the second test point. In Step S104, the test point candidate having the minimum test cost, that is, the observation point of the signal line 213, is determined as a test point of the test point number 2, and it is registered in the test point information (the row 1012 of FIG. 10).

Similarly, the processing is returned to from Step S107 to Step S103 to perform the test point index calculation process. FIG. 9C shows the test point index information formed during processing to determine the third test point. In Step S104, the test point candidate for the observation point of the signal line 203 is determined as the test point number 3, and it is registered in the test point information (the row 1013 of FIG. 10).

As a result, since the condition of the number of test points=3 set previously is satisfied in Step S107, the processing proceeds to the data output process of Step S108. In the data output process, the contents of FIG. 10 are output as the test point information 127.

By performing the above processes, the semiconductor integrated circuit of FIG. 3A becomes the semiconductor integrated circuit of FIG. 11 by insertion of the test points. The test points are "1-control point" 1111, "observation point" 1121 and "observation point" 1131, in the order from the test point number 1.

Here, comparison of testability will be made between the semiconductor integrated circuit (FIG. 3A) before inserting the test points, the semiconductor integrated circuit (FIG. 3B) having the test point inserted by the conventional method (the aforementioned method of B. Seiss et al.) and the semiconductor integrated circuit (FIG. 11). The calculated test costs based on the aforementioned COP are "1810" for FIG. 3A, "324" for FIG. 3B and "344" for FIG. 11. It can be understood that both of the testability of the circuit having a test point inserted by the conventional method and the testability of the circuit having a test point inserted by the present invention are substantially improved compared to that of the circuit before insertion of the test points. The testability of the circuit having a test point inserted by the present invention is slightly inferior, but nearly equal, to the testability of the circuit having the test point inserted by the conventional method. This shows that the analyzed signal lines are limited to signal lines capable of having a test point inserted therein in the present embodiment, but by obtaining optimum test points in the limited signal lines, it is possible to obtain a testability nearly equal to that in the case where the analyzed signal lines are not limited to signal lines capable of a test point inserted therein (the conventional method).

As described above, the apparatus for analyzing the test point of a semiconductor integrated circuit in accordance with the present invention has an effect in that a designer of a semiconductor integrated circuit can easily limit the signal lines to signal lines capable of having test points inserted therein and test point types using the test point insertion library 123 or the test point insertion prohibiting information 124, and the designer can specify test points maximizing the effect of testability by avoiding test points which are prohibited from being inserted.

An analysis method of test point insertion having a small effect on signal delay will be described below.

Initially, in regard to the circuit information 122, all the sets consisting of a cell type name, a pin number, a test point type and a circuit modifying method capable of inserting a test point are set in such a way that a signal delay from each of the input pins to an output pin of a cell before insertion of a test point and a signal delay from each of the input pins to the output pin of the cell after insertion of the test point are nearly equal to each other, or a difference between the signal delays is smaller than a signal delay from each of the input pins to an output pin of a cell having a 2-input AND function or a 2-input OR function. Since the signal delay of the cell depends on the cell structure, that is, the semiconductor manufacturing technology, the signal delay cannot be discussed at the level of a logic gate capable of inserting test points satisfying the above condition. However, an example will be shown.

An example concerns the cell exchange due to control point insertion, such as shown in the rows 411 to 414 of FIG. 4A. When the cell structure in which a test point function is add to a cell before test point insertion is formed, the cell after test point insertion can be constructed so that the overhead of the signal delay is made small. Further, the observation point insertion, such as shown in the rows 416 to 417 of FIG. 4A, is an example of the capability of inserting test points satisfying the above condition. In a case of observation point insertion, the difference in the overheads before insertion and after insertion is small. FIG. 4B is an example of a test point insertion library formed from the standpoint of reduction of the overhead of the signal delay due to test point insertion. The control point insertion concerns only the circuit modification (the lows 431, 432) replacing the cell INV1 to the cell NAND2 or NOR2, and the observation point insertion is considered for all signal lines (the row 433).

It is mentioned here what cell type is proper as a target cell for cell exchange in control point insertion. Generally, in a semiconductor integrated circuit, high drivability cells which have a large drivability, where "drivability" refers to the ability to drive signals, which cells are logically equivalent to buffers or inverter gates and are equipped to reduce delays in signal lines, each of which has a long distance or is connected to a plurality of branches. Cell type names of the high drivability cells are easily specified, and they are, in a semiconducter integerated circuit, in large numbers. So, it is desirable that the test point insertion library includes the above-mentioned cell types as the target cell types which are to be exchanged with cells of types having the same drivabilities for a control point in test point insertions. Thus, the difference in overheads before and after insertion of a test point is negligible small in the above manner of the cell exchange. The number of points, in each of which a control point is capable of being inserted, is enough large to improve the testability of the circuit easily. In a semiconductor integrated circuit composed as mentioned above, at least one of the cells with large drivability, which are equipped to reduce delays in signal lines, each of the signal lines having a long distance or being connected to a plurality of branches, is used as a part (for example, 2 NAND cell of which one input line is connected to a fip-flop having a scanning function used for a control point) forming one of the control points to be prepared for test point insertion.

On the other hand, in regard to the test point insertion library 123, the sets of a signal line in the circuit and a test point type prohibiting test point insertion are set in such a way as to be control points to be inserted into a signal line on a path having a small signal delay margin of the path between a terminal or a memory element and a terminal or a memory element. An example of forming test point insertion prohibiting information considering this signal delay will be described.

Initially, a table of paths with corresponding signal delay margins is formed using a tool for the signal of a semiconductor integrated circuit. FIG. 12 is an example listing paths having a small margin of signal delay which is obtained by calculating the signal delay of the a path between a terminal or a memory element and a terminal and the memory element in the semiconductor integrated circuit of FIG. 3A. That is, a table of signal delay margin (delay margin) 1204 corresponding to a path specified by a path start point 1202 and a path end point 1203. The rows are listed in increasing order of the delay margin from the row 1211 to the row 1219. Therein, the value of the signal delay margins in the figure are values given for the purpose of explanation, but not actually calculated values.

Paths in which insertion of a control point is prohibited are selected using this table from the standpoint of reducing the overhead of signal delay due to test point insertion. For example, in a case where insertion of a control point in the paths of the rows 1211 to 1213 having a small delay margin is prohibited, the prohibited path information of the test point insertion prohibiting information becomes as shown in column 631 of FIG. 6B. The rows 1211 to 1212 of FIG. 12 correspond to the rows 645 to 647 of FIG. 6B, respectively.

The test point analyzing process will be described with reference to the test point insertion library shown in FIG. 4B, described above, and the test point insertion prohibiting information shown in FIG. 6B for the semiconductor integrated circuit of FIG. 3A. In the test point insertion position limiting process S102, the test point insertion position information which is formed is that in which sets consisting of a signal line capable of inserting a test point and the test point type are a 1-control point and a 0-control point of the signal line 207 and an observation point of all the signal lines. Based on such information, the test point index calculation process S103 and the test point determining process S104 are repeated until the predetermined condition of the number of test points=3 is satisfied. The resultant test point information obtained is as shown in the table in FIG. 10, which is the same as in the first embodiment of the test point analyzing process.

Here, the overhead of signal delay due to test point insertion will be compared between the semiconductor integrated circuit (FIG. 3B) wherein test points are inserted by the conventional method (the method of B. Seiss et al. Described above) and the semiconductor integrated circuit (FIG. 11) wherein test points are inserted by the present embodiment. In the path from the terminals 221, 222, 223 to the terminal 242, the overhead in the conventional example is the signal delay corresponding to the AND2 cell 283 inserted as the 0-control point 281. On the other hand, the overhead in the present embodiment is only the signal delay produced by inserting the observation point 1121. In the path from the terminals 221, 222, 223 to the terminal 239, the overhead in the conventional example is the signal delay corresponding to the OR2 cell 273 inserted as the 1-control point 271 and the signal delay due to insertion of the observation point 291. On the other hand, the overhead in the present embodiment is a difference of the signal delays due to exchanging the INV1 cell 257 to for the NOR2 cell 1112 in order to insert a 1-control point 1111 and the signal delay by inserting the observation point 291. Therein, the overhead of the signal delay produced by the observation point insertion is only the overhead of the signal delay produced by the branched signal line, and can be negligible. Therefore, it can be understood that the overhead of the signal delay produced by test point insertion is large in the semiconductor integrated circuit formed by the conventional method, but the overhead of the signal delay produced by test point insertion is very small in the semiconductor integrated circuit formed by the present embodiment compared to that of the conventional method.

Further, the overhead of the circuit area due to test point insertion will be compared between the two circuits on the basis of an increased number of cells. In the conventional circuit, the AND2 cell and the OR2 cell used for the control points and the three flip-flops with scan function are increased. On the other hand, in the circuit of the present embodiment, only the three flip-flops with scan function are increased. Therefore, it can be said that the overhead of the circuit area due to test point insertion is smaller in the semiconductor integrated circuit of the present embodiment than in the semiconductor integrated circuit of the conventional method.

On the other hand, the testability is nearly equal in both circuits, as described above.

As has been described above, the apparatus for analyzing a test point of a semiconductor integrated circuit in accordance with the present invention has an effect in that the overheads of signal delay and circuit area due to test point insertion can be reduced by setting the test point insertion library 123 and the test point insertion prohibiting information 124 in such a way as to take the signal delay into consideration and that instruction of test points having an effect on testability nearly equal to the conventional method can be provided. Further, there is an effect in that since the apparatus for analyzing a test point in accordance with the present invention does not need to calculate signal delay, the processing can be performed at a high speed.

According to the present invention, it is possible to provide a method and an apparatus for fast analyzing test points in a semiconductor integrated circuit in which the overheads of the signal delay and the circuit area due to insertion of the test points are reduced, and which can process perform processing at a high speed and be easily usable.

FIG. 14 is a block diagram showing the composition of an embodiment of an apparatus for analyzing logic circuit test points in accordance with the present invention. The analyzing apparatus comprises an input unit 1401 for inputting information on elements and signal lines of the circuit; a calculation processing unit 1402 for calculating types and inserting positions of test points; a memory unit 1403 for storing circuit information 1422, test point index information 1423, test point effect information 1424, test point information 1425 and test point correlation information 1426; and a data output unit 1404.

The circuit information 1422 includes information on the kind of each element and signal lines connecting the elements in the logic circuit, information on assumed failures and, information on whether or not a test point can be inserted. The test point index information 1423 is numerical information reflecting total circuit testability and is expressed by a table of the test point index corresponding to each element of a group of test point candidates.

Here, the test point candidates are expressed by names of signal lines and types of test points. The name of a signal line is a name specifying a position of the signal line given by the circuit information. The type of test points is "1 control point", "0 control point" and "observation point".

The test point effect information 1424 indicates the presence or absence of a change in the test point index information by one test point or plural test points that have been inserted, and is composed of test point effect information regarding the test point candidates and test point effect information regarding signal lines required for the calculation. The test point effect information regarding signal lines is expressed by sets consisting of a signal line and a test point effect, and the test point effect information regarding the test point candidates is expressed by sets consisting of a test point candidate and a test point effect.

The test point information 1425 represents information on insertion positions of the test points and the circuits by sets consisting of a name of a signal line and a type of test point. The test point correlation information 1425 sets forth information on groups of test points of which regions (hereinafter, referred to as test point effecting region) in the circuit where the test point index is varied by insertion of the test point do not intersect one another by sets consisting of a test point and an identification number of a test point group. When the test point information 1425 or the test point correlation information 1426 is added or corrected, or new test point correlation information 1426 is formed, the test point information 1425 is sometime input directly from the data input unit 1401 in addition to the circuit information 1422.

The calculation processing unit 1402 composed of a test point index calculation portion 1411 for calculating the test point index information 1423 from the circuit information 1422; a test point effect calculation portion 1413 for calculating the test point effect information regarding the signal lines and the test point effect information regarding the test point candidates; and a test point determining portion 1412 for calculating the test points and the test point correlation information based on the test point index information 1423 and the test point effect information 1424.

Figure 15:
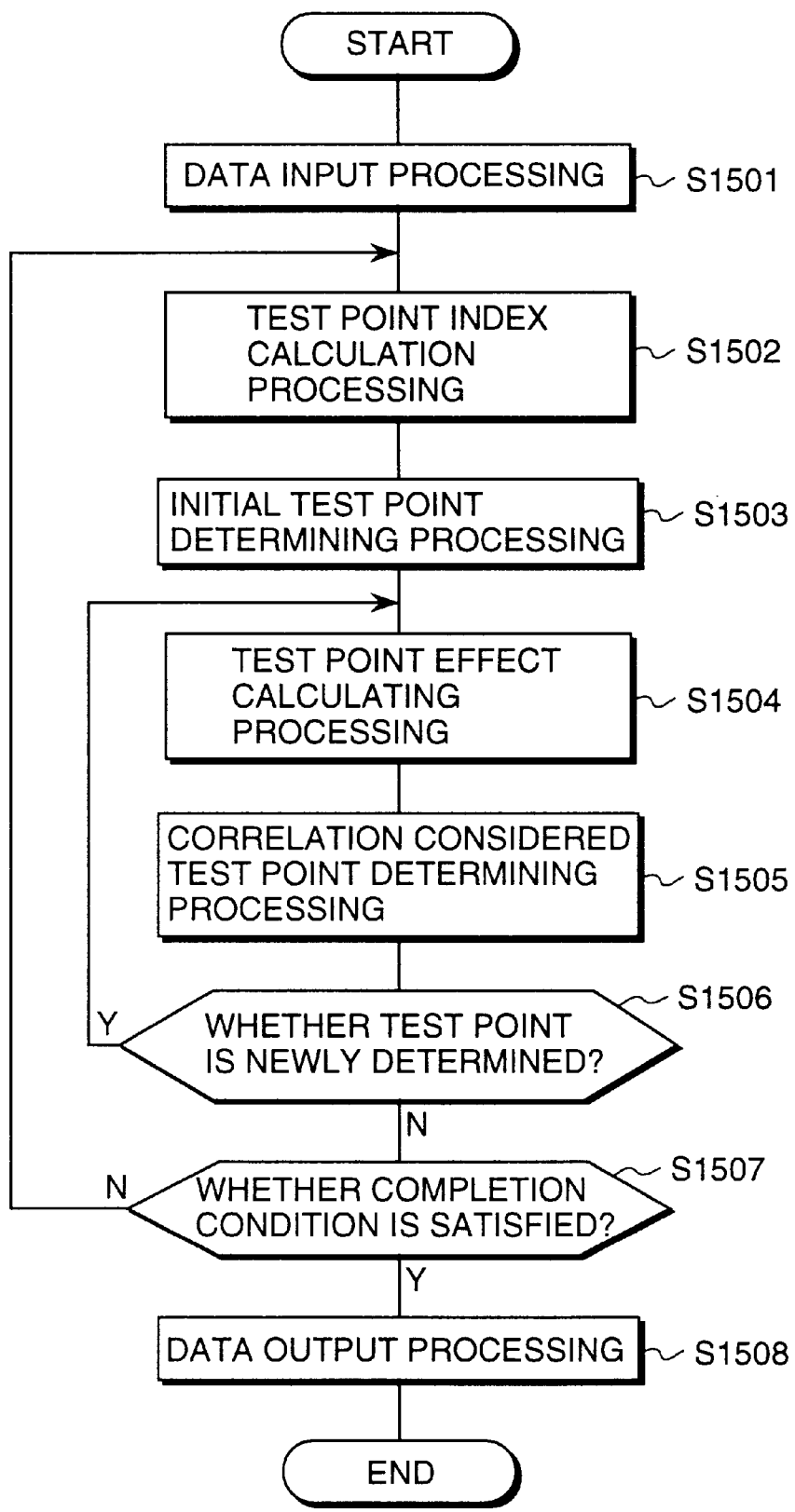
FIG. 15 is a flow-chart showing an embodiment of process carried out by the apparatus for analyzing logic circuit test points.

FIG. 15 is a flow-chart showing the process carried out by the apparatus for analyzing logic circuit test points. Step S1501 is a data input processing in which the circuit information 1422 is input by the data input unit 1401 and stored in the memory unit 1403. When the test point information 1425 is input in addition to the circuit information 1422, the circuit information 1422 is updated so as to reflect the test point information 1425.

Step S1502 is a test point index calculation processing by the test point index calculation portion 1411 in which the test point index information 1423 is formed by calculating a group of test point candidates and a test point index to each of the test point candidates from the circuit information 1422. Step S1503 is a initial test point determining processing by the test point determining portion 1412 in which a test point candidate having the highest testability is selected based on the test point index information 1423 and the test point candidate is initial-registered in the test point information 1425.

Step S1504 is test point effect calculation processing by the test point effect calculation portion 1413 in which the effect region of the test point just before registering into the test point information 1425 is calculated, and presence or absence of the test point effect for each of the test point candidates is checked, and the test point effect information 1424 is produced.

Step S1505 is a correlation considered test point determining processing by the test point determining portion 1412 in which a new test point is determined by selecting a test point candidate among the test point candidates using the test point index information 1423 which represents "ABSENCE" of the test point effect in Step S1504 and has a test point index exceeding a predetermined value, and this is registered in the test point information 1425.

In Step S1506, it is judged whether or not a test point is newly determined, and if a test point is newly determined, the processing is returned to S1504. Then, the processing is repeated in such a manner that the effect region of the test point just before registering into the test point information 1425 is calculated, and presence or absence of the test point effect for each of the test point candidates is checked, and if there is a test point candidate which represents "ABSENCE" of the test point effect in Step S1504 and has a test point index exceeding a predetermined value, it is registered in the test point information 1425. By doing so, test points not having intersections in the effect regions are instantaneously processed without re-calculating the test point index.

The test points instantaneously processed in S1504 to S1506 are given the same group number and are stored in the test point correlation information 1426 as a group of test points having effect regions not intersecting one another.

In Step S1506, if no test point is newly determined, it is judged in Step S1507 on a pre-determined completion condition of the test point analysis processing. If the completion condition is not satisfied, the processing is returned to Step S1502 and the test point index calculation processing of the logic circuit is executed including the test points which have been determined. Then, re-determination of the test point candidates, except for the test points which have been determined, and the initial test point determining processing are executed based on the test point index, and the above-mentioned processing is repeated. The completion condition is determined, for example, by an upper limit of the number of test points, a threshold value of the test point index, a limit of the processing time and so on.

When the completion condition is satisfied, the processing proceeds to Step S1508, and the test point information 1425 and the test point correlation information 1426 stored in the memory unit 1403 are output from the data output unit 1404 as output results of the apparatus for analyzing logic circuit test points. When the test point correlation information 1426 is not required to be output, the forming of the test point correlation information 1426 in Step S1505 and the outputting of the test point correlation information 1426 in Step S1508 may be omitted.

Figure 16A:
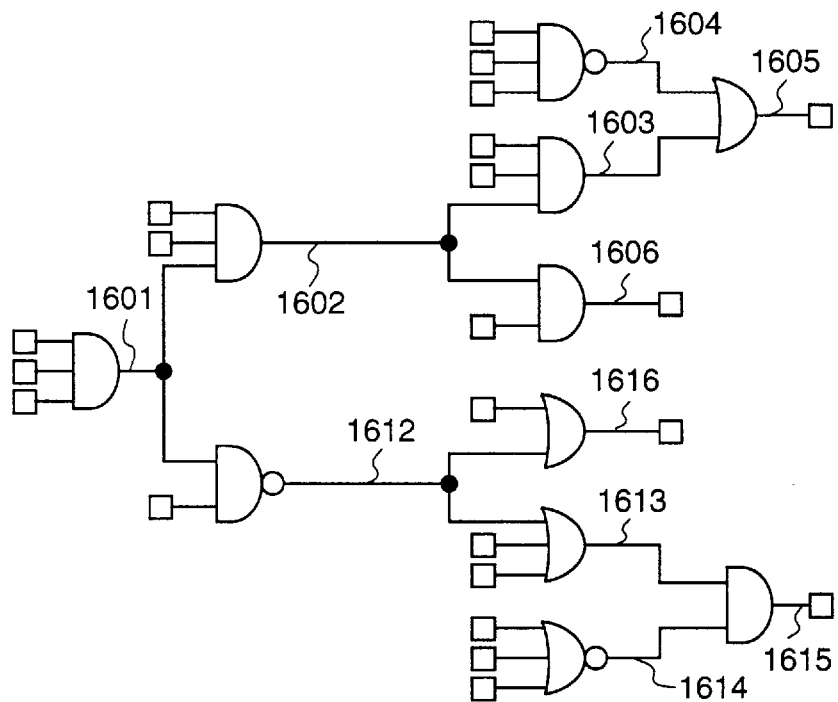
FIGS. 16A and 16B are a logic circuit diagram and the logic circuit diagram inserted with a test point, respectively.
Figure 16B:
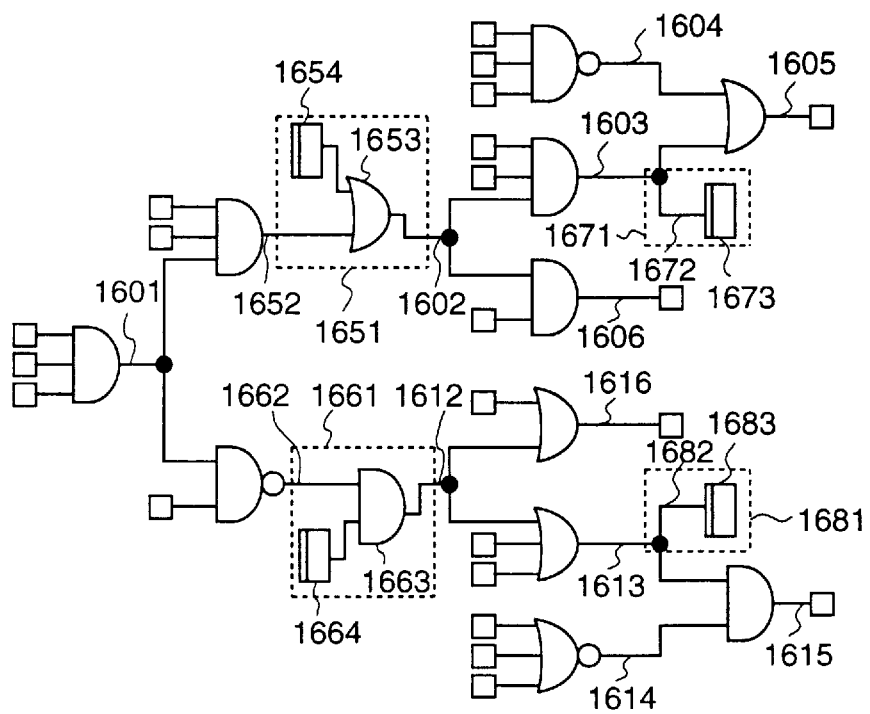

Here, to provide a detailed explanation of the test point analysis processing, the logic circuit, the circuit of the test point and the test point effect region will be described. FIG. 16A and FIG. 16B show examples of a logic circuit and test points, respectively, wherein the FIG. 16A shows an example of the circuit before inserting the test points, which is a logic circuit composed of AND gates, OR gates, NAND gates, NOR gates and input/output terminals. As for a failure group, failures of output lines of respective gates, that is, the signal lines 1601 to 1606 and signal lines 1612 to 1616 degenerating to signal value 0 (0-degenerating failures), and failures the output lines degenerating to signal value 1 (1-degenerating failures) are assumed.

FIG. 16B shows an example of a circuit where four test points are inserted into the circuit of FIG. 16A. A 1-control point 1651 is inserted in the signal line 1602, a 0-control point 1661 is inserted in the signal line 1612, an observation point 1671 is inserted in the signal line 1603, and an observation point 1681 is inserted in the signal line 1613.

The control point 1651 improves the 1-controllability of the signal line 1602. The control point 1651 is composed of a 2-input OR gate 1653 and a flip-flop with scan function 1654, and input lines of the OR gate 1653 are a normal input line connected to an input side portion 1652 of the signal line 1602 and a test data input line connected to the flip-flop with scan function 1654. An output line of the OR gate 1653 is connected to the signal line 1602. The flip-flop with scan function 1654 outputs a signal value input by a scan chain at testing, but always outputs the signal 0 during normal operation.

The control point 1661 improves the 0-controllability of the signal line 1612. The control point 1661 is composed of a 2-input AND gate 1663 and a flip-flop with scan function 1664, and input lines of the AND gate 1663 are a normal input line connected to an input side portion 1662 of the signal line 1612 and a test data input line connected to the flip-flop with scan function 1664. An output line of the AND gate 1663 is connected to the signal line 1612. The flip-flop with scan function 1664 outputs a signal value input by a scan chain at testing, but always outputs the signal 1 during normal operation.

The observation point 1671 improves the observability of the signal line 1603. A flip-flop with scan function 1673 is connected to the signal line 1672 branched from the signal line 1603. Similarly, the observation point 1681 improves the observability of the signal line 1613. A flip-flop with scan function 1683 is connected to the signal line 1682 branched from the signal line 1613.

Figure 17A:
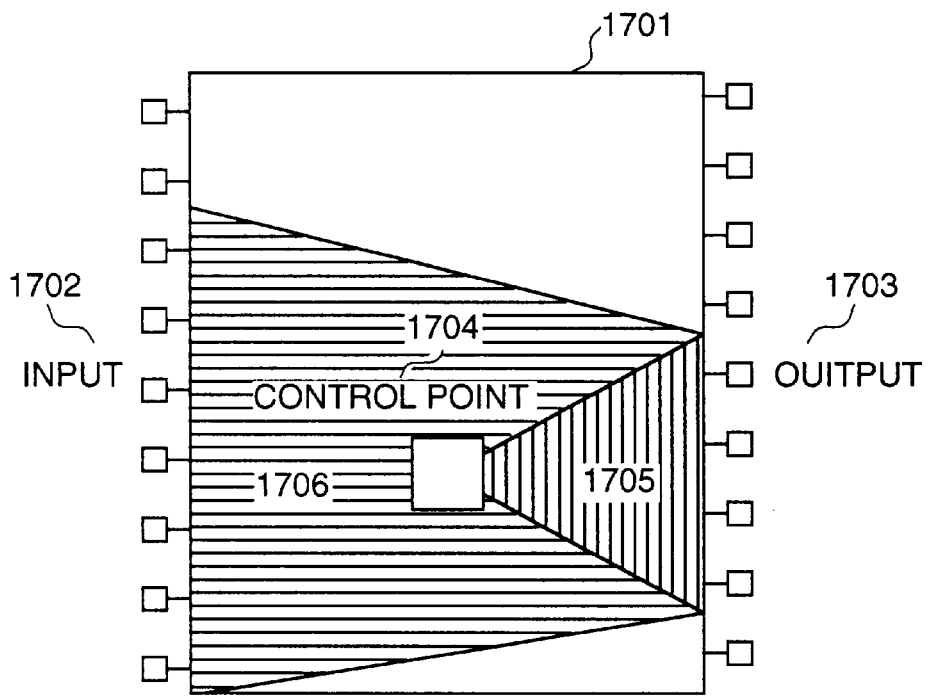
FIGS. 17A and 17B are conceptual diagrams explaining regions affected by respective test points.
Figure 17B:
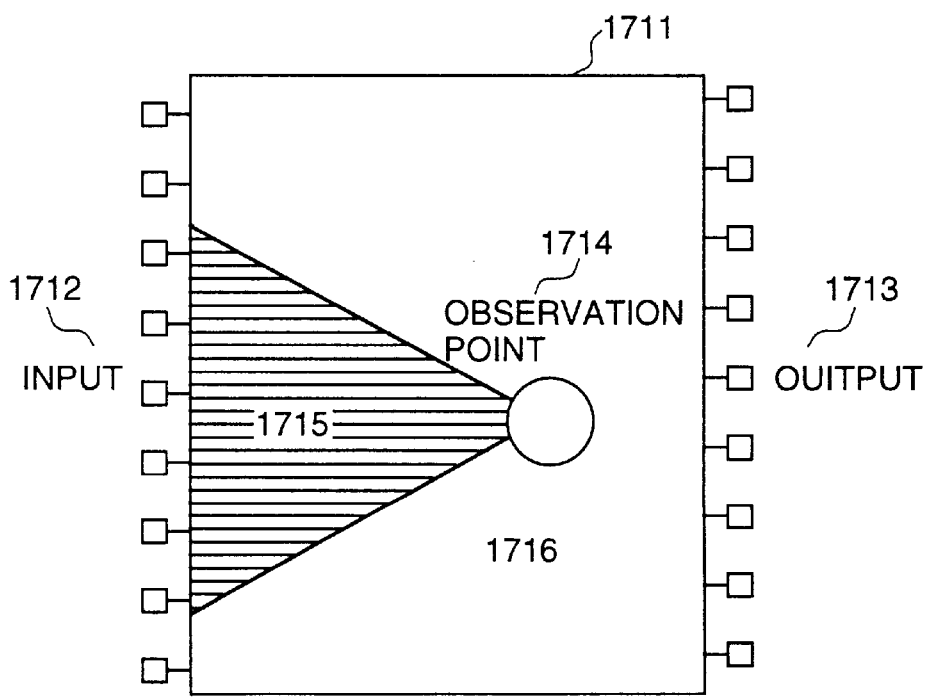

FIG. 17A and FIG. 17B are views explaining test point effect regions. FIG. 17A shows an effect region of a control point. An input element group of the logic circuit 1701 is indicated by the reference character 1702 and an output element group is indicated by the reference character 1703. A region of controllability varied by the control point 1704 is the vertical striped sub-circuit 1705 connected from a signal line at a position placing the control point 1704 toward the output side. A region of observability varied by the control point 1704 is the sub-circuit 1705 and the horizontal striped sub-circuit 1706 connected from outputs included in the sub-circuit 1705 toward the input side. In these sub-circuits 1705, 1706, since the controllability, the observability or both are varied, test point candidates on signal lines within the sub-circuits are varied in the test point index information. Therefore, the test point effect information for the signal lines contained in the sub-circuits 1705, 1706 indicates "PRESENCE", and the test point effect information to the other signal lines, for example, the signal lines contained in the sub-circuit 1707 is "ABSENCE".

Referring to FIG. 17b, signal lines in the region of controllability varied by the control point 1651 are the signal lines 1602, 1603, 1605 and 1606. Signal lines in the region of observability varied by the control point 1651 are the signal lines 1606, 1605, 1604, 1603, 1602 and 1601.

FIG. 17B shows an effect region of a observation point. An input element group of the logic circuit 1711 is indicated by the reference character 1712 and an output element group is indicated by the reference character 1713. A region of observability varied by the control point 1714 is the sub-circuit 1715 connected from a signal line at a position placing the observation point 1714 toward the input side. In this case, the controllability is not varied by the observation point 1714. In the sub-circuit 1715, since the observability is varied, test point candidates on signal lines within the sub-circuit are varied in the test point index information. Therefore, the test point effect information for the signal lines contained in the sub-circuit 1715 indicates "PRESENCE", and the test point effect information to the signal lines contained in the sub-circuit 1716 indicates "ABSENCE".

FIGS. 18A–18D are views showing the intersection of effect regions of two test points. In these figures, an input element group of the logic circuit 1801 is indicated by the reference character 1802, an output element group is indicated by the reference character 1803, and a control point is indicated by the reference character 1804. A region 1805 indicates a test point effect region of the control point 1804. Explanation will be made below for the case shown in FIG. 18A where one test point is included in an effect region of the other test point for, a case shown in FIG. 18B where the effect regions of two test point are not intersected by each other, and cases shown in FIGS. 18C and for 18D where the effect regions of two test points intersect each other, but neither of the two test points is included in the effect region of the other test point.

Figure 18A:
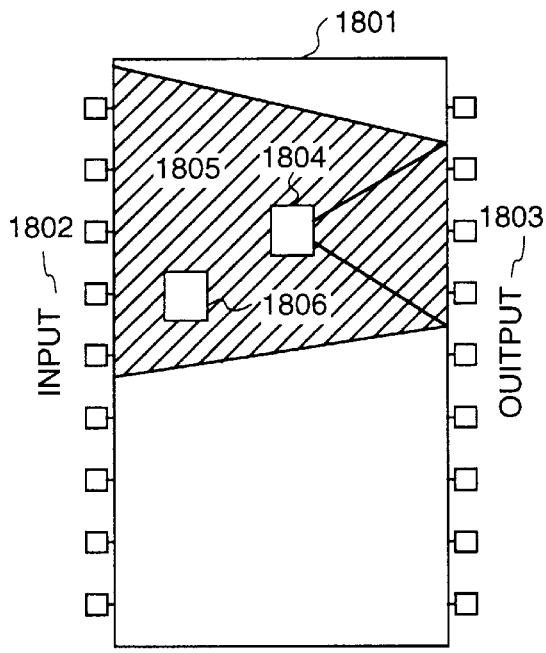
FIGS. 18A–18D are conceptual diagrams for explaining the mutual relationship of two test points.

In FIG. 18A, the control point 1806 is included in the effect region of the control point 1804. In this case, the state is one in which the two control points are in strong correlation. The relationship of the strong correlation can be similarly defined in a case of a control point and an observation point, and a case of two observation points. In a case where two test point candidates are in the strong correlation, the controllability/the observability in the effect region of one test point is varied when the other test point candidate is determined as a test point. Therefore, the test point index information needs to be updated.

In the embodiment of FIG. 16B, the region of the strong correlation by the control point 1651 includes the signal lines 1601, 1602 to 1606. The region of the strong correlation by the control point 1661 includes the signal lines 1601, 1612 to 1616.

Figure 18B:
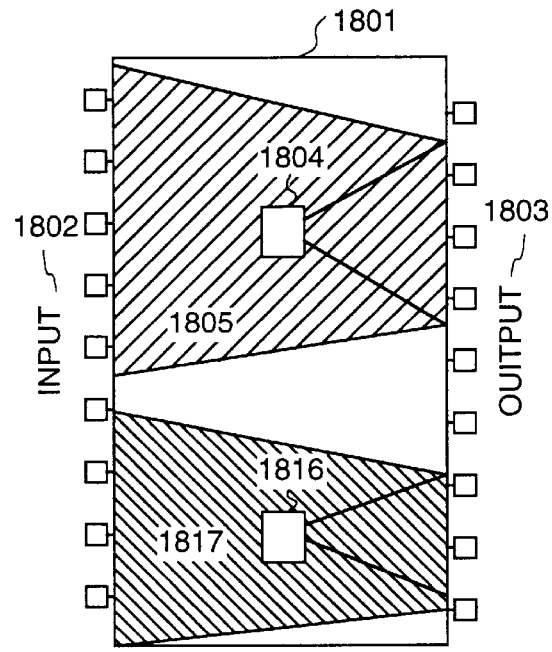

In FIG. 18B, the test point effect region 1817 of the control point 1816 is not intersected by the test point effect region 1805 of the control point 1804. In this case, the state is on in which the two control points are independent. The relationship of the independence can be similarly defined in a case of a control point and an observation point, and a case of two observation points. In a case where two test point candidates are independent, the controllability / the observability in the effect region of one test point is not varied even if the other test point candidate is determined as a test point. Therefore, the test point index information does not need to be updated.

Figure 18C:
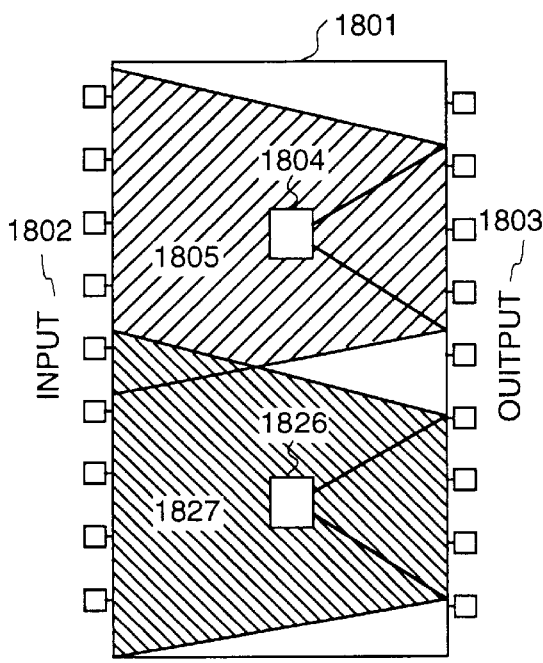

In FIG. 18C, the test point effect region 1827 of the control point 1826 intersects with the test point effect region 1805 of the control point 1804, but the control point 1826 is not included in the test point effect region 1805 of the control point 1804, and the control point 1804 is not included in the test point effect region 1827 of the control point 1826. In this case, the state is on in which the two control points are in a weak correlation. In the embodiment of FIG. 16B, the effect regions of the control point 1651 and the control point 1661 are intersected at the signal line 1601.

In a case where two test point candidates are in a weak correlation, the controllability in the effect region of one test point is not varied but part of the observability is varied when the other test point candidate is determined as a test point. Therefore, strictly, the test point index information needs to be updated. However, it has been confirmed from a test of the inventors that there is no practical problem even if test point candidates which are in a weak correlation are dealt with as "ABSENCE" of the test point effect. Of course, whether or not the test index is re-calculated may be determined depending on the maximum processing time or a specific purpose, such as optimization of the test point insertion position or the like.

Figure 18D:
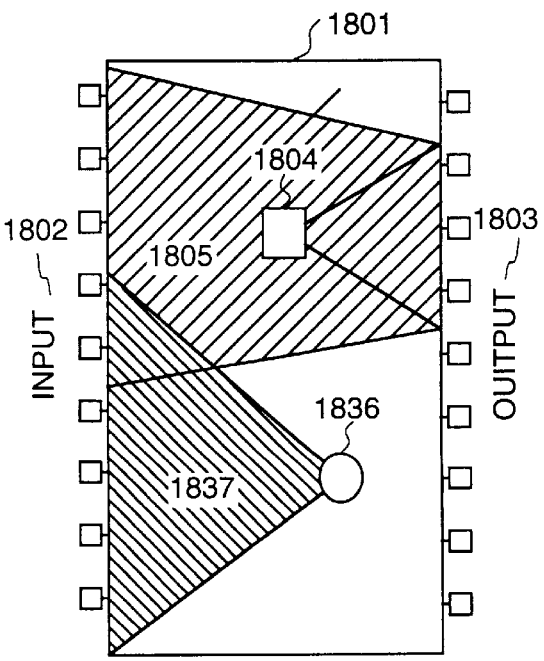

In FIG. 18D, the test point effect region 1837 of the observation point 1836 intersects with the test point effect region 1805 of the control point 1804, but the observation point 1836 is not included in the test point effect region 1805 of the control point 1804, and the control point 1804 is not included in the test point effect region 1837 of the observation point 1836. In this case, the two control points are in a weak correlation. In such a case, part of the observability in the effect region of one test point is varied when the other test point candidate is determined as a test point. In a case of a control point and an observation point, the weak correlation can be defined as the cases shown in FIGS. 18C and 18D. However, in a case of two observation points, the weak correlation is not defined.

Figure 19:
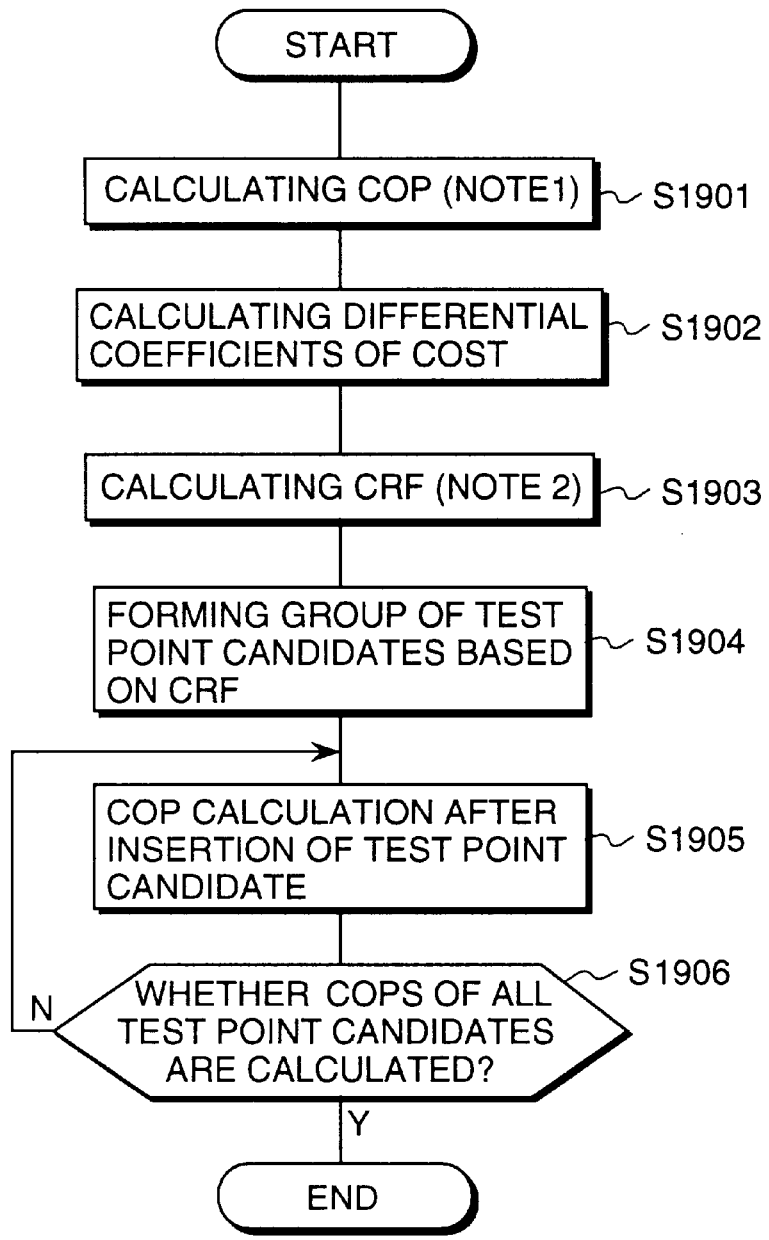
FIG. 19 is a flow-chart showing details of the test point index calculation process in FIG. 15.

Description will be sequentially made below concerning the processing procedure of each portion of the calculation processing apparatus executed in each of the steps of FIG. 15. FIG. 19 is a flow-chart showing the details of the test point index calculation process of Step S1502. This processing is executed by the test point index calculation portion 1411, which calculates a scale of probabilistic testability referred to as COP, which is described above as a test point index. However, the invention is not limited to the use of COP, but any index can be used so long as the index expresses the effect of improving testability.

In Step S1901, a COP before insertion of test points is calculated. Calculation of the COP is performed by calculating the controllability (1-controllability) from the input side toward the output side and calculating the observability from the output side toward the input side. And, a failure detecting probability is calculated. The failure detecting probability is a product of a probability that a signal line having a failure, from each of various assumed failures, has a signal value at failure which is different from a signal value in normal state and a probability that the signal line failure can be detected. That is, a failure detecting probability of a 0-degenerating failure is a product of a 1-controllability and an observability, and a failure detecting probability of a 1-degenerating failure is a product of a 0-controllability and an observability. Therein, "0-controllability=1−1−controllability". Further, The objective function of the test cost is defined as a value obtained by adding the reciprocal of the failure detecting probability to all failures. This is a value equivalent to an expected value of the number of test patterns for detecting one failure, and since it reflects testability of a whole circuit, the testability becomes higher as the cost is smaller.

In Step S1902, a differential coefficient of test cost in regard to observability and a differential coefficient of test cost in regard to controllability are calculated for each of the signal lines. The details of a calculation method set forth in an article entitled "Testability-Driven Random Test-Pattern Generation" by R. Lisanke, et al. IEEE Transactions on Computer-Aided Design Vol. CAD-6 pages 1082–1087 (1987).

In Step S1903, CRF (Cost Reduction Factor) is calculated for each of the test point candidates. The CRF is an approximate value of test cost difference (ACR: Actual Cost Reduction) by insertion of a test point, that is, an approximate value of subtracting a test cost inserting a test point (candidate) from a test cost before inserting the test point. A signal line to be a test point candidate is a signal line capable of accepting a control point and a signal line capable of accepting an observation point, and is selected depending on a value of the CRF.

Since the details of the calculation method of CRF are described in the above-mentioned reference of B. Seiss, there are a $CRF_c$ of control point and $CRF_o$ of an observation point. There is a good correlation between the CRF and the ACR, and it is preferable to insert a test point in a signal line having a larger value of the CRF. However, since the CRF is an approximate value, it is required to calculate a test cost in a case where a test point is actually inserted.

In Step S1904, test point candidates satisfying a condition are selected based on the CRF, and a group of the test point candidates is formed. The condition of the CRF for the test point candidates is an upper limit of the number of test points pre-determined in decreasing the order of the CRF, or a certain ratio to the maximum value of the CRF. The test point candidates selected by the CRFc value are control point candidate, and the test point candidates selected by the $CRF_o$ value are observation point candidate.

In Step S1905 and Step S1906, COP (controllability, observability, test cost) is calculated for all elements of the group of the test point candidates. Using the result, test point index information 1423 of a group of sets consisting of a test point candidate and a test cost is produced.

Figure 20:
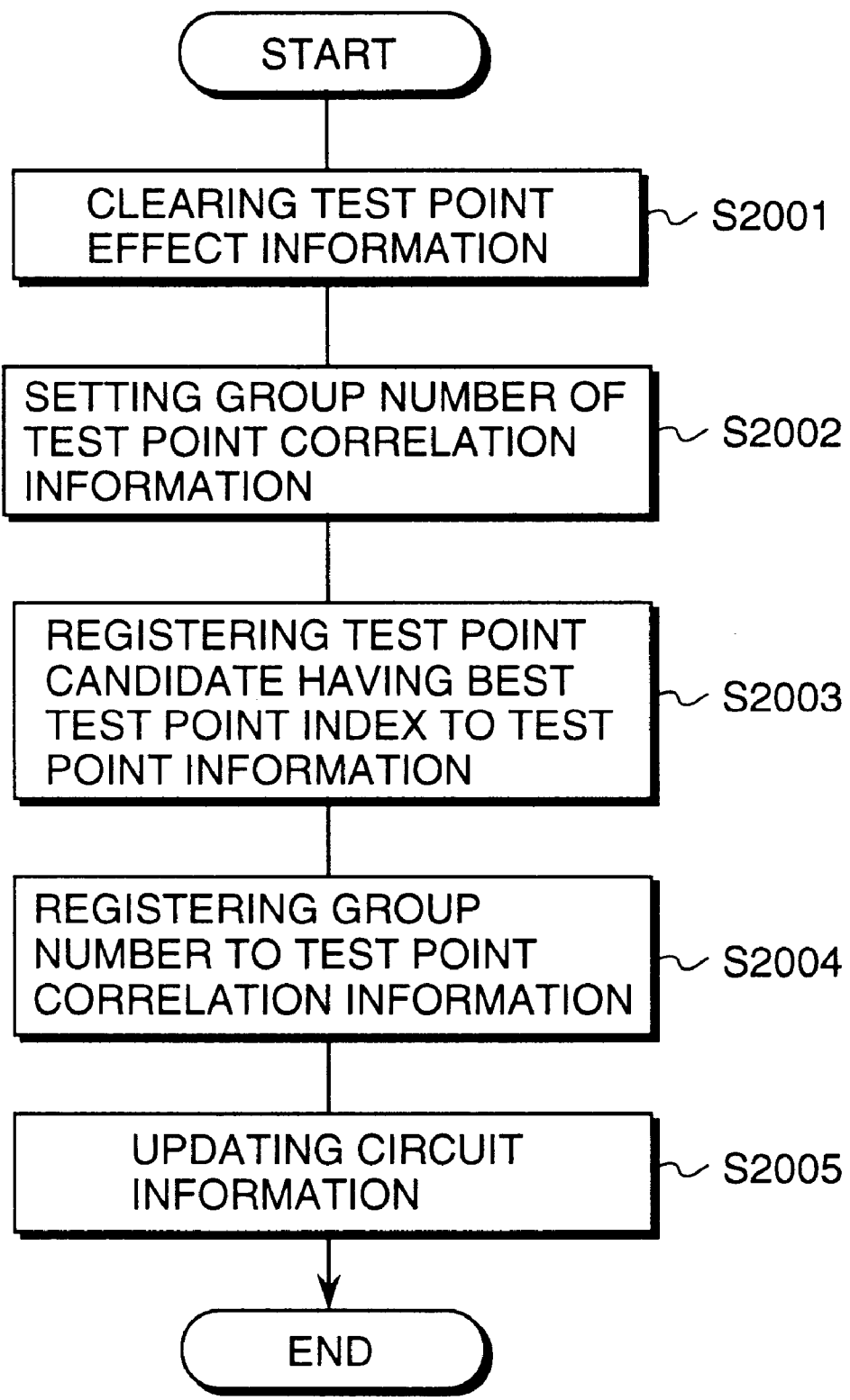
FIG. 20 is a flow-chart showing details of the initial test point determining process in FIG. 15.

FIG. 20 is a flow-chart showing the details of the initial test point determining process of Step S1503. The processing is executed in the test point determining portion 1412.

In Step S2001, all contents of the test point effect information 1424 are cleared to "ABSENCE" of test point effect. That is, the test point effects for all the signal lines are set to "ABSENCE", and the test point effects for all the test point candidates are set to "ABSENCE". In Step S2002, new group numbers would have not been used at that time are given the group number of the test point correlation information 1426. In Step S2003, a test point having the best test point index, that is, a test point candidate having the minimum test cost among the test point index information 1423 is determined as a test point, and the name of the signal line and the type of the test point are registered in the test point information 1425. Then, in Step S2005, the circuit information 1422 is updated to circuit information having the test point inserted.

Figure 21:
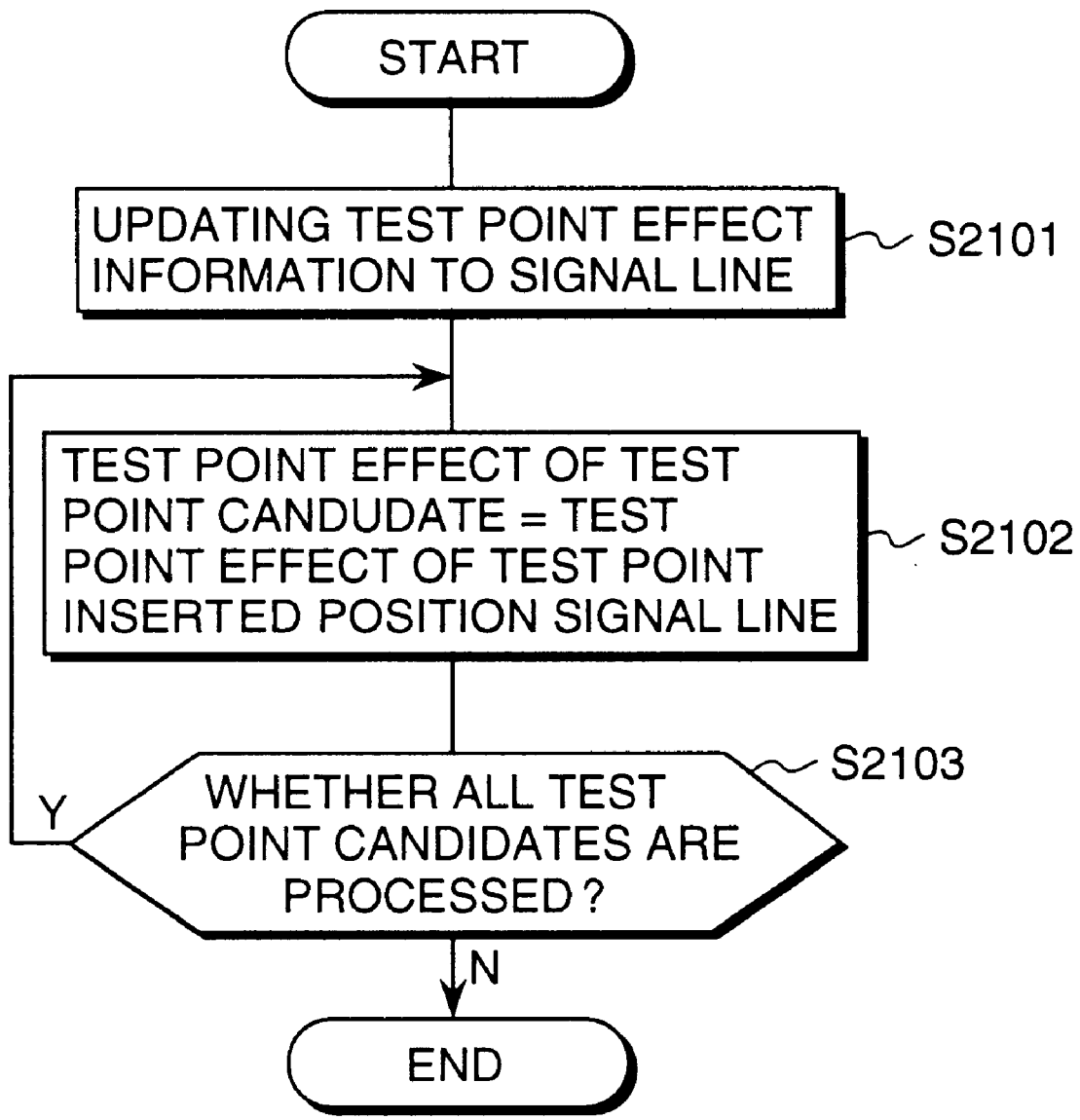
FIG. 21 is a flow-chart showing details of the test point effect calculation process in FIG. 15.

FIG. 21 is a flow-chart showing the details of the test point effect calculation process of Step S1504. This process is executed by the test point effect calculation portion 1413. Here, a test point candidate in a weak correlation with the other test point is dealt with as "ABSENCE" of the test point effect.

In Step S2101, the test point effect region of a test point determined just before is calculated, and test point effects to signal lines within the effect region are set to PRESENCE. Test point effects to signal lines outside the effect region are not updated. Then, in Step S2102, "PRESENCE"/ "ABSENCE" of the test point effect calculated in regard to a test point insertion position is set. The processing is repeated for all of the test point candidates in Step S2103.

According to the process procedure, since the test point effect calculation processing (S1504) is a processing to search for the connection relationship between signal lines from the circuit information, the processing time of the test point effect calculation processing (S1504) is a proportional to the number of gates in the worst case, because the number of objective elements is less than the number of gates. Therefore, the processing time of the test point effect calculation processing (S1504) is substantially smaller than that of the test point index calculation process S1502 for calculating the COP (controllability, observability, test cost), and does not become a bottleneck in the processing time in the whole of the test point analysis processing.

Figure 22:
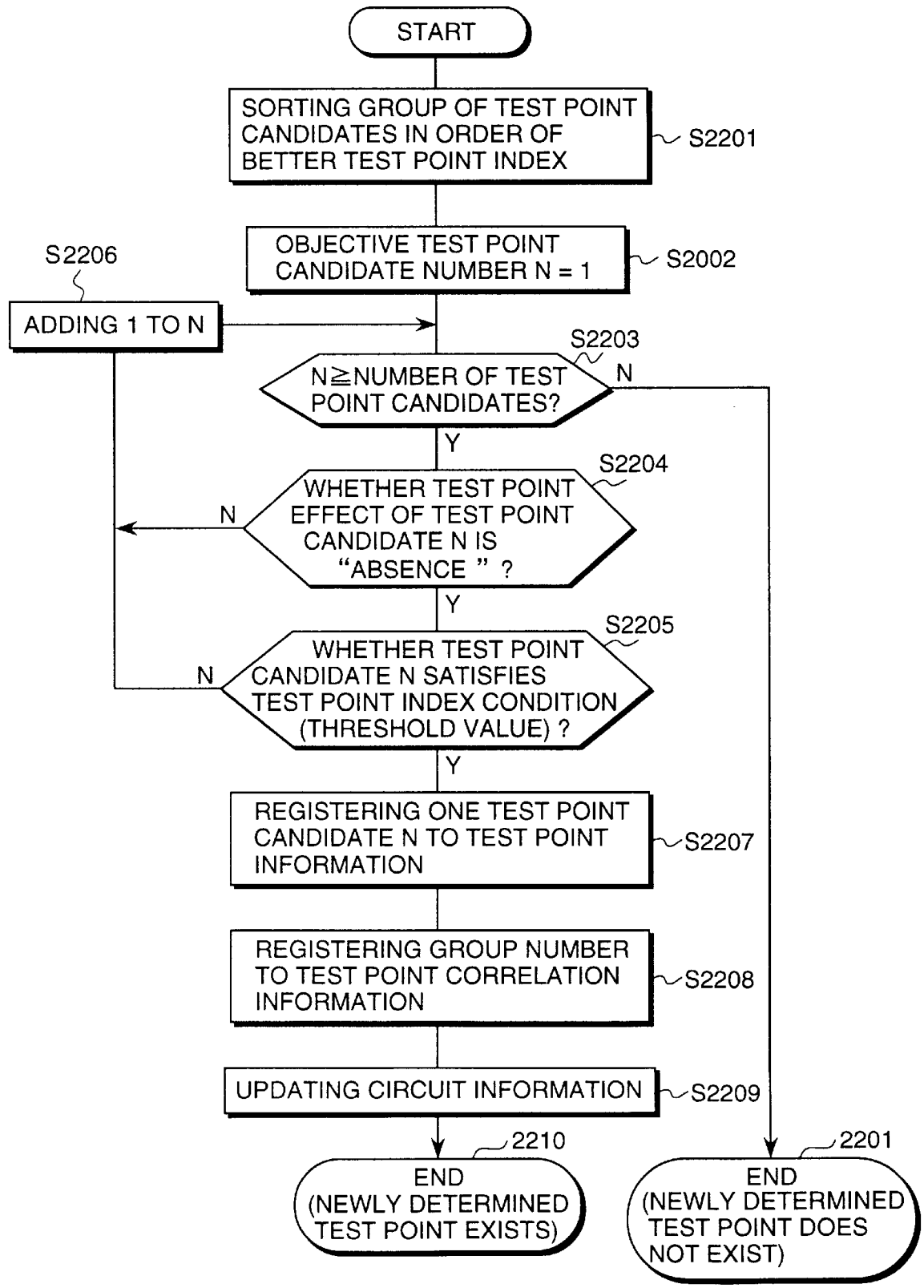
FIG. 22 is a flow-chart showing details of the correlation considered test point determining process in FIG. 15.

FIG. 22 is a flow-chart showing the details of the correlation considered test point determining process of Step S1505. This processing is executed by the test point determining portion 1412.

In Step S2201, the group of the test point candidates is sorted in order of better test point index using the test point index information 1423, and a test point candidate number is sequentially assigned thereto from 1. In a case where the test point index is the test cost, the sorting order becomes the increasing order of test cost. In order to execute processing of the test point candidates in a sorting order of the test point index in the following process, the number N of the objective test point candidates is set to 1 in Step S2202.

In Step S2203, it is judged whether or not all the test point candidates are processed by comparing the number N of the objective test point candidate with the number of test point candidates. If the number N is smaller than the number of test point candidates, it is judged in Step S2204 whether or not the test point effect of the test point candidate N is "ABSENCE", and further it is judged in Step S2205 whether or not the test point candidate N having "ABSENCE" of the test point effect satisfies the test point index condition. If the test point candidate N does not satisfy these two conditions the, number N of the objective test point candidate is increased by 1 in Step S2206, and the processing is returned to Step S2203.

In a case where the test point candidate N satisfies the two conditions, in Step S2207, the name of the signal line and the type of the test point of the test point candidate N are registered by one to the test point information 1425. Then, in Step S2208, the test point group number (the number set in Step S2002 of FIG. 20) corresponding to the test point registered just before is set to the test point correlation information 1426. Further, in Step S2209, the circuit information 1422 is updated by inserting the test point registered just before, and the processing ends in Step S2210. Further, a returning value a newly determined test point existing is returned. When the returning value of a newly determined test point existing is returned, in Step S1506 of FIG. 15 the control is returned to S1504.

On the other hand, if the number N of the objective test point candidate is larger than the number of test point candidates, that is, if all of the test point candidates do not satisfy the two condition of Steps S2204 and S2205, the processing is completed in Step S2211 and a returning value of a newly determined test point not existing is returned. With this returning value, in Step S1507 of FIG. 15, the completion condition is judged, and if it is not satisfied, the control is returned to Step S1502.

The test point index condition in Step S2205 is, for example, in a case where the test point index is the test cost by the COP as described above, "a difference between the test cost after insertion of a test point candidate and a test cost before insertion of the test point candidate is larger than a value of multiplying a predetermined value to a difference between the cost after insertion of a test point determined just before and the cost before insertion of the test point". That is in an, since the test cost of the test point candidate in the processing order is increasing order, a certain ratio of the difference just before is compared with the difference at this time, and while the latter difference is within a comparatively large range, that is, while a reduction effect of the test cost can be expected, the processing is repeated. However, when the test cost of the inserted test point candidate becomes large and reaches a test point index condition by which a reduction effect of the test cost cannot be expected, the processing is stopped.

The above is an explanation of the structure and the processing procedure of the apparatus for analyzing logic circuit test points in accordance with the present invention. The operation performed by the logic circuit of FIG. 16A will be described in detail below, referring to the process flow of FIG. 15. It is assumed here that the completion condition of Step S1507 is that the number of newly determined test points=4.

Initially, in Step S1501, the information of FIG. 16A as the circuit information 1422 is input. The assumed failures are 0-degenerating failures and 1-degenerating failures on output lines of respective elements, that is, the signal lines 1601 to 1606 and signal lines 1612 to 1616. It is assumed that signal lines capable of accepting a control point or an observation point are output lines of the respective elements, that is, the signal lines 1601 to 1606, 1612 to 1616.

Next, in Steps S1901 to S1903 of the calculation process of Step 1502, the values, such as the COP and so on, are calculated. FIG. 23A is a table showing the calculation values of COP, differential coefficients and CRF.

In the figure, the column 2311 indicates signal line numbers in FIG. 16A. The column 2312 to column 2315 indicate values calculated in Step S1901, and indicate 1-controllability (C), observability (O), failure detecting probability of 0-degenerating failure (P(0)), and failure detecting probability of 1-degenerating failure (P(1)) for the signal lines of the column 2311. In Step S1901, the reciprocals of the respective values of the column 2314 and the column 2315 are accumulated, and test costs 2320 are also calculated. In the case of this logic circuit, a failure having a minimum failure detecting probability is a 0-degenerating failure of the signal line 1603, and the probability is "0.001", and the test cost is "1810".

The column 2316 and the column 2317 indicate values calculated in Step S1902, and indicate differential coefficients (dU/dO) of test cost in regard to observability and differential coefficients (dU/dC) of test cost in regard to 1-controllability. Since the test cost becomes smaller by decreasing the 1-controllability when dU/dC is positive, it is preferable to insert a 0-control point. On the other hand, since the test cost becomes smaller by increasing the 1-controllability when dU/dC is negative, it is preferable to insert a 1-control point. The column 2318 and the column 2319 are CRF calculated in Step S1903, and include $CRF_o$ when an observation point is inserted and CRFc when a control point is inserted.

Next, in Steps S1904 to S1906, the test point index information 1423 shown in the column 2402 to column 2405 of FIG. 24A is obtained. The column 2402 indicates test point candidates which are expressed by sets consisting of a signal line 2403 and a test point type 2404. In Step S1904, five groups of the test point candidates are selected having large values from the CRF and CRF of FIG. 23A. Selection of 1-control point or 0-control point is according to the differential coefficient dU/dC of the candidate point. The column 2405 indicates the test cost to be used as the test point index which is obtained by calculating COP after inserting a test point candidate in Steps S1905 and S1906.

Based on the test point index information 1423 shown in FIG. 24A, the initial test point determining processing of Step S1503 is performed. In regard to the test point effect information 1424 which is used following this processing, test point effect information relative to test point candidates is shown in the column 2411 to the column 2413 of FIG. 24A, and test point effect information relative to signal lines is shown in the column 2502 to the column 2504 of FIG. 25A. The test point effect information is indicated by "PRESENCE" or "ABSENCE".

In the initial processing of Step S2001, all the test point effects (1) to the test point candidates are set to "ABSENCE", as shown in the column 2411, and all the test point effects (1) to the signal lines are set to "ABSENCE", as shown in the column 2502. And, in Step S2002, the group number of the test point correlation information 1426 is set to 1. Next, in Step S2003, from the column 2405 of FIG. 24A, a "1-control point" of the signal line 1602 of the test point having the minimum test cost is selected and registered in the test point information 1425 as a test point.

FIG. 26A and FIG. 26B show tables of the test point information. As the column 2601 to the column 2604 of FIG. 26A, the determined test points 2602 are expressed by consisting of a signal line 2603 and a test point type 2604. Here, in the frames of the test point number 1, 1602 is indicated as the signal line and "1-control point is indicated" as the test point type. Then, in Step S2004, the test point group number 1 is indicated as the test point correlation information 1426 as shown in the column 2605.

The setting and transition of the test point effect information 1424 by the test point effect calculation processing of Step S1504 will be described below. Here, the test point effect information for a test point candidate in a weak correlation with another test point is set to "ABSENCE".

In Step S2101, a test point effect region of the test point number 1 is calculated, and the test point effect information for the signal line is updated. As for the effect of the "1-control point" of the signal line 1602, the region of varying controllability includes the signal lines 1603, 1605, 1606 from the signal line 1602 toward the output side as described above. The region of varying observability includes signal lines from the signal lines 1605, 1606 of the output portion of varying controllability connecting inversely toward the input side, that is, the signal lines 1601 to 1606. Therefore, the effect region of the test point number 1 to the individual signal lines is that the signal lines 1601 to 1606 are "PRESENCE" and the other signal lines are "ABSENCE", as shown in the column 2503 of FIG. 25A.

In Step S2102 and S2103, test point effect information to the test point candidates is set as shown in the column 2412 of FIG. 24A, based on the column 2503 showing the test point effect for signal lines by the test point number 1. To the test point candidates of numbers 1, 2 and 3, the test point effect of the corresponding signal lines 1603, 1604 and 1605 are set as "PRESENCE". To the test point candidates of numbers 4 and 5, the test point effect of the corresponding signal lines 1612 and 1613 are set as "ABSENCE".

Setting and transition of the test point information 1425 and the test point correlation information 1426 by the correlation considered test point determining processing of Step S1505 will be described below.

In Step S2201, the test point index information of the columns 2402 to 2405 of FIG. 24A is re-arranged in increasing order of the test point index 2405 (test cost). The column 2401 in the figure indicates the re-arranged numbers in an increasing order. In Step S2202 to Step S2206, it is judged in the increasing order from the test point candidate number 2 whether or not the test point candidate has "ABSENCE", of the test point effect in Step S2204 and satisfies the test point index condition in Step S2205.

The test point index condition here is assumed to be a difference between the test cost (for example, in a case of the test pint candidate number 2, 894) after insertion of a test point candidate and a test cost (1810) before insertion of the test point candidate, and is larger than a value (93.9) obtained by multiplying 0.1 by a difference between the test cost (871) after insertion of the test point of number 1 just before and the test cost (1810) before insertion of the test point. This index condition is equivalent to that where the test point index after insertion of the test point candidate is smaller than 1716.1, and all the test point candidates number 2 to number 5 satisfy this condition.

Consequently, the test point candidates which have "ABSENCE" of the test point effect and satisfy the test point index condition are number 4 and number 5, but the candidate number 4 ("0-control point" of the signal line 1612) having the smaller test cost is selected first. Then, in Step S2207, the signal line and the test point type corresponding to the test point candidate having candidate number 4 are registered in the frames of the test point number 2 of FIG. 26A. Further, in Step S2208, the test point group number=1 corresponding to the test point of the test point number 2 is set. Further more, in Step S2210, the returning value of newly determined test point existence is returned, and thus the correlation considered test point determining processing S1505 is completed.

Next, in Step S1506, the processing is returned to the test point effect calculation processing of Step S1504 since the test point is newly determined. Since the test point effect region of "0-control point" of the signal line 1612 determined just before includes the signal lines 1601, 1612, 1613, 1614, 1615 and 1616, all of the test point effect information for these signal lines are set to "PRESENCE". As the result, the test point effect (3) for the signal lines is changed as shown in the column 2504 of FIG. 25A. Further, the test point effect (3) for the test point candidates is changed as shown in the column 2413 of FIG. 24A.

Next, the processing proceeds to the correlation considered test point determining process of Step S1505 again. At that time, according to the test point effect information 2413 to the test point candidates, there is no test point candidate having "ABSENCE" of the test point effect information (the candidate number 5 is also changed to "PRESENCE"). Therefore, in Step S2211 of FIG. 22, the correlation considered test point determining processing is completed, and the returning value of the newly determined test point not existing is returned. By this returning value, it is judged in Step S1507 whether or not the completion condition is satisfied. Since the set number of the test points at the present is 2, which does not satisfy the completion condition of number of test points=4, the processing is returned to Step S1502.

In the test point index calculation process of Step S1502, the test costs 2340 are calculated by calculating COP for the logic circuit inserted with the test points 1, 2 registered in the test point information, as shown in the columns 2331 to 2335 of FIG. 23B. In regard to failures taken into consideration when calculating the test cost, in addition to the failures on the signal line of the column 2331 of FIG. 23B, failures on the output lines of the elements included in the inserted test points are also considered in this example. And, differential coefficients of test cost and CRFs are calculated as shown in the columns 2336 to 2339 of FIG. 23B. Based on the CRFs, five test point candidates having a large CRF are selected, and a test point index (test cost) for each of the test point candidates is calculated. The formed test point index information is shown in the columns 2422 to 2425 of FIG. 24B.

In the initial test point determining process of Step S1503 in the next step, all of the contents of the initial test point effect (1) for the signal line and the test point effect (1) for the test point candidates are cleared to "ABSENCE", as shown in column 2512 of FIG. 25B and column 2431 of FIG. 24B, respectively. Then, the observation point of the signal line 1603 of a test point candidate having the minimum test cost is selected as the test point of the test point number 3, and registered for the test point information 1425. The test point group number here is "2". The test point information and the test point correlation information at that time are shown in test point numbers 1 to 3 of FIG. 26B.

Further, in the test point effect calculation process of Step S1504, a test point effect region by the observation point of test point number 3 is calculated. The test point effects (2) for the signal lines are shown in the column 2513 of FIG. 25B, and the test point effects (2) for the test point candidates are shown in column 2432 of FIG. 24B.

In the correlation considered test point determining process of Step S1505, the observation point of the signal line 1613, which has a minimum test cost among the test point candidates having "ABSENCE" of the test point effect (2) and which satisfy the test point index condition, is registered to the test point information 1425 as the test point of test point number 4. The test point group number is "2". The test point information and the test point correlation information at that time are shown in test point numbers 1 to 4 of FIG. 26B.

In Step S1507, since the completion condition for the number of test points =4 is satisfied as a result, the processing proceeds to Step S1508. In the data output process, the contents of FIG. 26B are output as the test point information 1425 and the test point correlation information 1426.

From the above, the logic circuit of FIG. 16A becomes as seen in FIG. 16B by inserting the test points. From the test point number 1, the test points are "1-control point" 1651, "0-control point" 1661, "observation point" 1671 and "observation point" 1681.

The calculated results of COP to the logic circuit of FIG. 16B are shown in FIG. 23C. The test cost shown in column 2360 is "252", and it can be understood that the test cost is substantially improved compared to the test cost "1810" before insertion of the test point shown in FIG. 23A. Further, the 0-degenerating failure on the signal line 1601 of "0.0278" is substantially improved compared to the minimum failure detecting probability before insertion of the test points of "0.0010 (0-degenerating failure on the signal line 1603)". Therefore, it can be recognized that the logic circuit after insertion of the test points shown by FIG. 16B has a higher testability compared to the logic circuit shown in FIG. 16A.

Here the processing time of the test point analysis of the present embodiment shown in FIG. 15 will be is discussed. Most of the processing time in the analysis is used in the COP calculation (S1905) after insertion of the test point candidates in the test point index calculation process of Step S1502. This processing is the loop processing of Steps S1905 to S1906 in the loop of Steps S1502 to S1507, and the nest of loops becomes deepest. The number of the former loops is equal to the number of the test point candidates. On the other hand, the number of the latter loops is a number equal to a value obtained by subtracting the number of the test points determined only by the correlation considered test point determining process S1505 from the total number of test points set as the completion condition. That is, the processing time can be shortened by the number of test points determined only by the former.

Further, the total processing time for analysis of the test points will be calculated. It is expected that the number of test points pointed out by the correlation considered test point determining process S1505 increases approximately by the ½ power of number of gates. This is because the step number of elements in the logic circuit is not largely changed, but the number of input/output elements and the number of memory elements are increased even when the scale of a logic circuit is increased, and accordingly the number of sub-circuits not having correlation among them in the logic circuit is increased. Further, assuming that the number of test point candidates, the number of test points and the calculating time of the COP are proportional to the number of gates, the total processing time of the test point analysis processing is proportional to the 2.5 power of the number of gates in the worst case. If calculation is performed only for the signal lines changing value, that "is, if the" so-called inventory-driven method is employed in the COP calculation process, the calculating time is proportional to the ½ power the number of gates. Therefore, the total processing time of the test point analysis processing is proportional to the 2 power of the number of gates. As described above, the processing time in the present embodiment is substantially shortened compared to the conventional method and falls within a practical time range.

On the other hand, the capability of minimizing the test cost by the correlation considered test point determining process in the present embodiment, that is, the effect of testability is approximately equal to that of the conventional method. This is because, in a signal line having "ABSENCE" of test point effect, the relative numerical value of the test point index is not different between a case where, after determining the test point, the circuit information is updated and the test point index is re-calculated, and a case where the test point index before determining the test point is used.

As described above, the apparatus for analyzing logic circuit test points of the present embodiment can perform, determination of the test points having the effect of testability in an equal level at a high speed by reducing the COP calculation of the test point index calculating portion 1411 by providing the test point effect calculation part 1413 for executing the test point effect calculation process and the test point determining portion 1412 for executing the correlation considered test point determining process.

Another embodiment of the present invention will be described below. In the second embodiment of an apparatus for analyzing logic circuit test points, the test point determining process is performed using information for dividing the logic circuit into a plurality of sub-circuits. The basic composition of the present embodiment is the same as that shown in FIG. 14 and FIG. 15.

Figure 27:
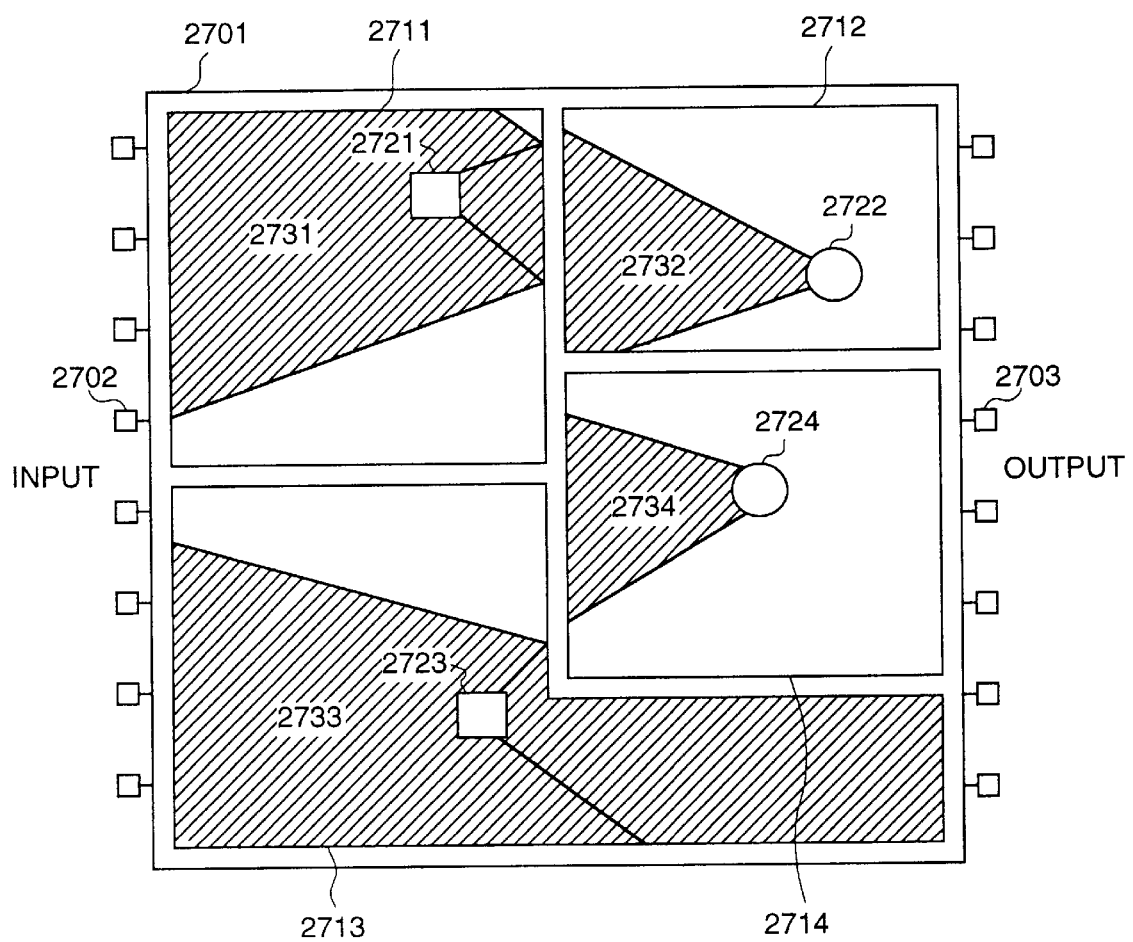
FIG. 27 is a conceptual diagram for explaining use of divided circuit information performed in another embodiment of a test point analysis process in accordance with the present invention.

FIG. 27 is a view showing test point effect regions using information for dividing the logic circuit into a plurality of sub-circuits. An input element group of the logic circuit 2701 is indicated by the reference character 2702 and an output element group is indicated by the reference character 2703. The logic circuit 2701 is divided into sub-circuits 2711, 2712, 2713 and 2714 by the information for dividing the logic circuit into a plurality of sub-circuits. Test points 2721 and 2723 are control points, and test points 2722 and 2724 are observation points.

When a test point effect region is limited to a sub-circuit containing the test point, effect regions of the test points 2721, 2722, 2723 and 2724 are regions 2731, 2732, 2733 and 2734, respectively.

In the test point effect calculation process S1504, calculation of the effect region by limiting it to a sub-circuit can be performed only by limiting signal lines to be calculated to signal lines in the above-mentioned sub-circuit in the processing of Step S2101 in FIG. 21.

In the test point index calculation process S1502, calculation of the test point indexes to the test point candidates is limited to the sub-circuit containing the test point candidates. That is, in the processing of Step S1905 in FIG. 19, a cost of the whole circuit after insertion of the test point candidates is calculated by calculating controllability and observability for the signal lines inside the sub-circuit containing the test point candidates and using controllability and observability for the other signal lines before inserting the test point candidates.

The information for dividing the logic circuit into a plurality of sub-circuits uses information of a logic block in logic design. Otherwise, information to divide the circuit may be formed prior to the test point analyzing processing. However, it is preferable to divide the circuit so as to make the correlation between the sub-circuits as small as possible, or so as to make number of connections between the sub-circuits as small as possible.

According to this embodiment, in the test point effect calculation processing S1504, the number of signal lines requiring the test point effect calculation can be reduced. Similarly, in the test point index calculation process S1502, the number of signal lines requiring the controllability and observability calculation after insertion of the test point candidates can be decreased. Accordingly, these processes can be performed at high speed.

Figure 28:
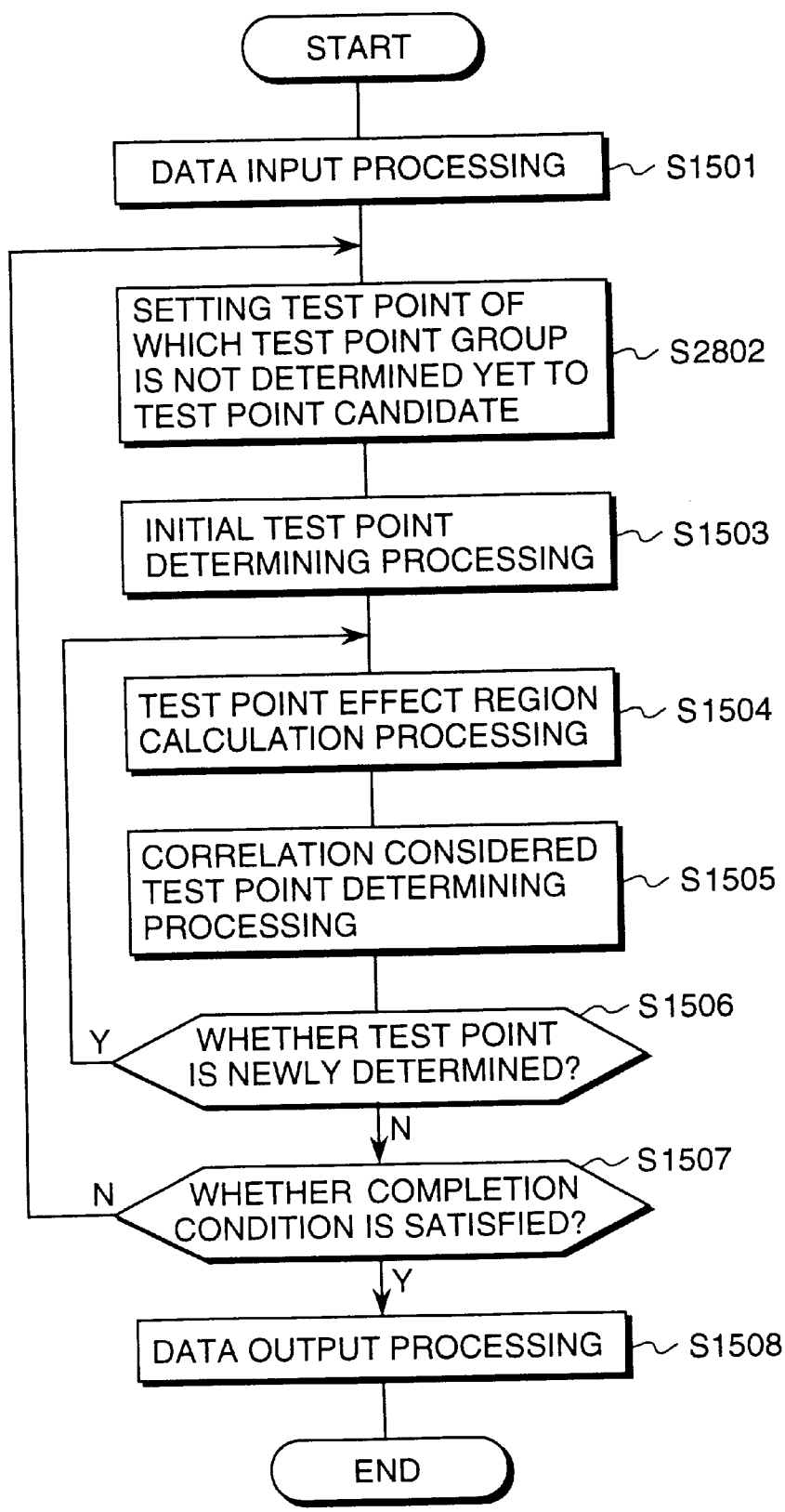
FIG. 28 is a flow-chart for calculating from test point information to test point correlation information of another embodiment for a test point correlation information analysis in accordance with the present invention.

An embodiment of the test point correlation information analysis process will be described below. In this embodiment, only the test point correlation information 1426 is produced from existing test point information 1425. FIG. 28 is a flow-chart of the test point correlation information processing of the present embodiment. The main difference the embodiment of the logic circuit test point analysis process of FIG. 15 is that the test point index calculation process S1502 is not executed, but preset test points are used as test point candidates (Step S 2802).

That is, after the circuit information 1422 is input in Step S1501, in Step S2802, test points of the test point correlation information have not determined the test point group yet, that is, in the initial stage, all the preset test points are set as test point candidates. The following processes are performed similar to in the first embodiment. A test point candidate having a minimum test cost among the test point candidates is set as a test point, and the test point effect region is calculated. In a case where a test point candidate not included in the effect region can be determined as a test point, the effect region is calculated and a further new test point is calculated. This process is repeated. Each of the test points determined by this repeating process is given with the same group number. On the other hand, in a case where no new test point is determined and a predetermined number of test points is not attained, the processing is returned to Step S2802, and all the test points not determined in the test point group are set as new test point candidates, and the above process is repeated until the completion condition is attained.

In the process procedure of the present embodiment, since grouping of test points is performed by the test point effect information without referring to the test point index information when the test points are already determined, the number of test points belonging to each of the test point groups is increased. The group number indicating that test points are not in the mutual effect region, that is, the test point correlation information becomes useful information for design of a test point circuit. As will be described later, the test points of the same group number can share a part of the test point circuit, for example, a flip-flop with scan function for a test point.

An embodiment of a semiconductor integrated circuit to which the above-mentioned logic circuit test point analysis method is applied will be described below. Test points of this integrated circuit are optimized so as to be arranged by the above-mentioned test point information. Further, it is an example that the test point correlation information displays its effect in reduction of the overhead of the test point circuit area.

Figure 29:
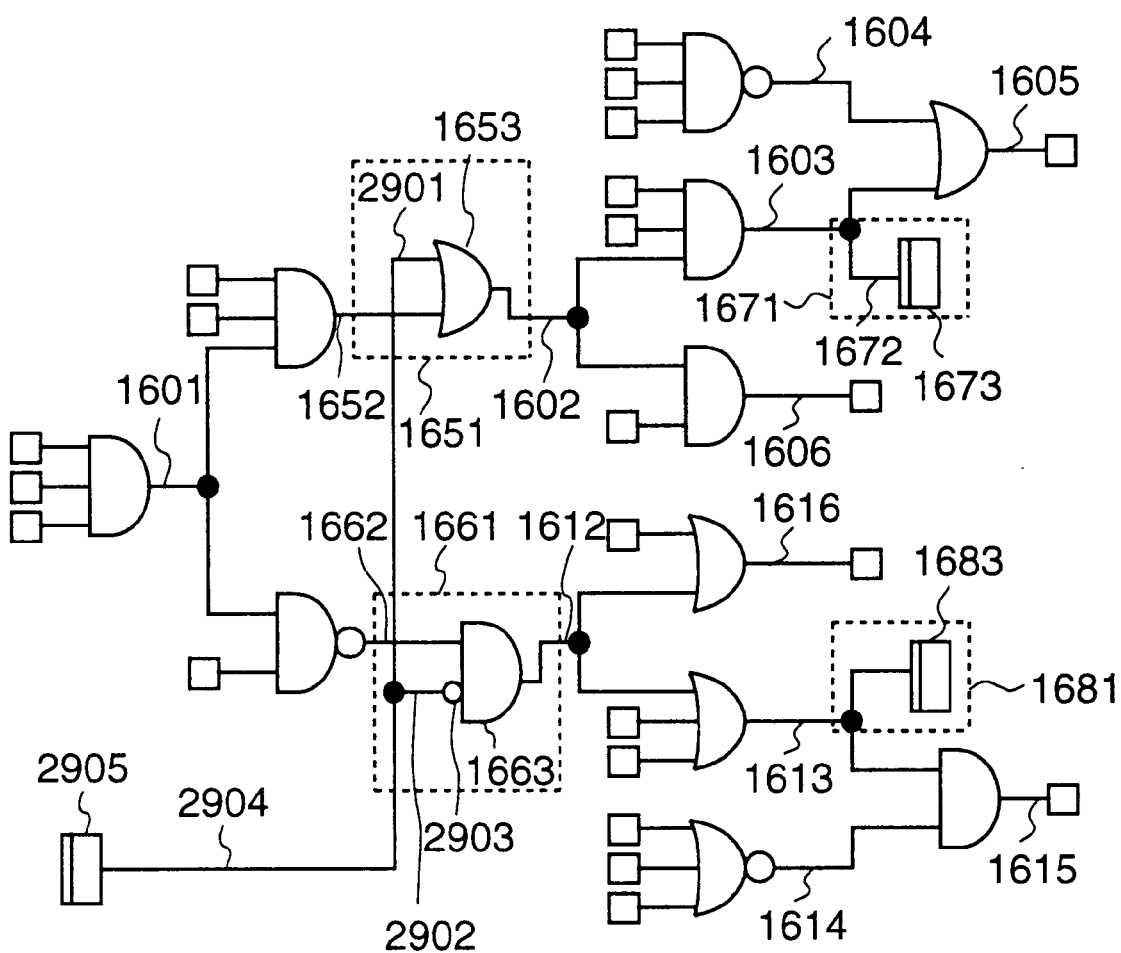
FIG. 29 is a diagram showing the composition of another embodiment of a semiconductor integrated circuit in accordance with the present invention.

FIG. 29 is a diagram showing the composition of a semiconductor integrated circuit based on the present embodiment. The semiconductor integrated circuit is an example of application of the present embodiment to the logic circuit of FIG. 16B having four test points, and the circuit composition is changed in a control point 1651 inserted in the signal line 1602 and a control point 1662 inserted in the signal line 1612, and the others are the same as in the logic circuit of FIG. 16B. The effect region of the control point 1651 and the effect region of the control point 1662 do not intersect, and both control points are included do the intersect group.

That is, the flip-flop with a scan function 1654 connected to the test data input line of the "1-control point " 1651 and the flip-flop with a scan function 1664 connected to the test data input line of the "0-control point" 1661 are replaced by one flip-flop with a scan function 2905 to be used in common, and the output line 2904 is branched into a signal line 2901 and a signal line 2902, which are input to the element 1653 and the element 1663, respectively. However, an inversion value of the signal line 2902 is input to the element 1663 by a NOT gate 2903 so that the control points 1651 and 1661 do not function during normal operation. The flip-flop with a scan function 2905 is always set to a signal value 0 during normal operation.

In the circuit composition of the figure, even if the same signal is input to the test data input lines of the two independent control points 1651, 1661 connected to the flip-flop with a scan function 2905, the regions affected by the signal in the circuit do not intersect. Therefore, it is possible to attain an equivalent effect of testability in a case where two flip-flops with a scan function are respectively provided to the two control points 1651 and 1661, and different signals are input to the test data input lines. Therefore, it is possible to reduce the overhead of the circuit area for the input elements, such as flip-flops with a scan function and the like.

In regard to the condition that data input lines of a plurality of test points can be replaced by one flip-flop with a scan function to be used in common, it is preferable that the test points are independent, but the condition may be satisfied when the test points are in a weak correlation.

As described above, according to the present embodiment, in a semiconductor integrated circuit having a plurality of test points, when the plurality of test points have test point correlation information which is independent of one another or a weak correlation, the overhead of the circuit area can be reduced while the testability is being maintained by sharing one flip-flop with a scan function with test data input lines of the plurality of test points.

According to the present invention, it is possible to provide a practically usable analysis apparatus which is capable of fast analyzing test points in a logic circuit.

Further, according to the present invention, it is possible to contribute to the design of a test point circuit having a small overhead because it is possible to easily provide the test point correlation information indicating the groups of which test point effect regions intersect each other.

Furthermore, according to the present invention, it is possible to provide a semiconductor integrated circuit in which the overhead of the circuit area due to inserting of the test points is reduced based on the test point correlation information.

What is claimed is:

1. A method of analyzing semiconductor integrated circuit test points for determining test point insertion positions and circuit modifying ways for modifying a semiconductor integrated circuit formed by connecting a plurality of cells with signal lines, said method comprising the steps of:

storing a test point insertion library which includes information on sets of a cell type for which a test point can be inserted, a pin number, a test point type and a circuit modifying way, with respect to said plurality of cells and signal lines composing said semiconductor integrated circuit; and determining test point insertion positions and circuit modifying ways, based on said test point insertion library.

2. A method of analyzing semiconductor integrated circuit test points according to claim 1, wherein said test point insertion library which lists sets of a cell type capable of being inserted as a test point, a pin number, a test point type and a circuit modifying way, includes a set in which a signal delay from each of input pins to an output pin of a cell before insertion of a test point and a signal delay from each of said input pins to said output pin after insertion of said test point are nearly equal to each other, or a difference between said signal delays is smaller than a signal delay from each of said input pins to an output pin of a cell having a 2-input AND function or a 2-input OR function.

3. An apparatus for analyzing semiconductor integrated circuit test points for determining test point insertion positions and circuit modifying ways for modifying a semiconductor integrated circuit formed by connecting a plurality of cells with signal lines, said apparatus comprising:

a memory for storing a test point insertion library which includes information listing sets of a cell type capable of being inserted as a test point, a pin number, a test point type and a circuit modifying way, which are prepared for said plurality of cells and signal lines;

a test point insertion position limiting portion for determining a distinction between capability and incapability of insertion of a test point for each of said test point types for each of said signal lines in said circuit from circuit information of said semiconductor integrated circuit and said test point insertion library, and obtaining test point insertion position information which includes information of a test point and a circuit modifying way corresponding to said test point when said test point is determined to be capable of being inserted;

a test point index calculation portion for calculating an index expressing a degree of testability for each set of a signal line capable of having a test point inserted therein and said test point type, assuming that said test point of said set inserted; and a test point determining portion for determining a signal line having a large index expressing a degree of testability and a test point type corresponding to said signal line as a test point from among said signal lines capable of having a test point inserted therein.

4. An apparatus for analyzing semiconductor integrated circuit test points according to claim 3, wherein said test point insertion library which lists sets of a cell type capable of being inserted as a test point, a pin number, a test point type and a circuit modifying way, includes a set in which a signal delay from each of input pins to an output pin of a cell before insertion of a test point and a signal delay from each of said input pins to said output pin after insertion of said test point are nearly equal to each other, or a difference between the signal delays is smaller than a signal delay from each of a plurality input pins to an output pin of a cell having a 2-input AND function or a 2-input OR function.

5. A method of analyzing semiconductor integrated circuit test points for determining test point insertion positions and circuit modifying ways of a semiconductor integrated circuit formed by connecting a plurality of cells with signal lines, said method comprising the steps of:

preparing in advance a test point insertion library listing sets of a cell type capable of being inserted as a test point, a pin number, a test point type and a circuit modifying method prepared for said plurality of cells and signal lines;

preparing in advance test point insertion prohibiting information which is prepared to specify sets of a signal line and a test point type for which test point insertion with respect to said plurality of cells and signal lines composing said semiconductor integrated circuit is prohibited; and determining test point insertion positions and circuit modifying methods, based on said test point insertion library, by excluding sets of a signal line and a test point type specified in said test point insertion prohibiting information.

6. A method of analyzing semiconductor integrated circuit test points according to claim 5, wherein said test point insertion prohibiting information specifies signal lines on a path as signal lines in which insertion of test points is prohibited, said path being specified by designating a starting point and an end point of said path, and includes information expressing said start point and said end point of said path by any one of a signal line name, a terminal name, a set of cell position and pin number, a set of a cell type name and a pin number, all input terminals/controllable elements, and all output terminals/observable elements.

7. A method of analyzing semiconductor integrated circuit test points according to claim 5, wherein said test point insertion prohibiting information includes information which specifies signal lines in a block as signal lines in which test point insertion is prohibited, said block being specified by designating a sub-circuit in said integrated circuit.

8. An apparatus for analyzing semiconductor integrated circuit test points for determining test point insertion positions and a circuit modifying method for modifying a semiconductor integrated circuit formed by connecting a plurality of cells with signal lines, said apparatus comprising:

a memory for storing test point insertion prohibiting information which specifies sets of a signal line and a test point type for which test point insertion is prohibited;

a test point insertion position limiting portion for obtaining test point insertion position limiting information which links discrimination of capability or incapability of test point insertion for each test point type for each signal line in said circuit by using circuit information of said circuit and said test point insertion prohibiting information;

a test point index calculation portion for calculating an index expressing a degree of testability for each set of a signal line and a test point type capable of being inserted under the condition of absence or presence of a test point already set in said circuit, assuming that said test point of said set is inserted; and a test point determining portion for determining a set of a signal line and a test point type having a large testability as determined by said index expressing a degree of testability as a test point from among said obtained set of a signal line and a test point type capable of having a test point inserted therein.

9. An apparatus for analyzing semiconductor integrated circuit test points according to claim 8, wherein said test point insertion prohibiting information specifies signal lines on a path as signal lines for which insertion of test points is prohibited, said path being specified by designating a starting point and an end point of said path, and includes information expressing said start point and said end point of said path by any one of a signal line name, a terminal name, and a set of cell position and pin number.

10. An apparatus for analyzing semiconductor integrated circuit test points according to claim 8, wherein said test point insertion prohibiting information includes information which specifies signal lines in a block as signal lines for which test point insertion is prohibited, said block being specified by designating a sub-circuit in said integrated circuit.

11. An apparatus for analyzing semiconductor integrated circuit test points for determining test point insertion positions and circuit modifying ways for modifying a semiconductor integrated circuit formed by connecting a plurality of cells with signal lines, said apparatus comprising:

a memory for storing a test point insertion library which lists sets of a cell type capable of being inserted as a test point, a pin number, a test point type and a circuit modifying way for said plurality of cells and signal lines in order to specify a test point type capable of being inserted and a circuit modifying method for each signal line specified by a cell type and a pin number in said semiconductor integrated circuit;

a test point insertion position limiting portion for determining a distinction between capability and incapability of insertion of a test point for each of said test point types corresponding to each of said signal lines by using test point insertion prohibiting information which specifies sets of a signal line and a test point type for which test point insertion is prohibited, circuit information of said semiconductor integrated circuit and said test point insertion library, and obtaining test point insertion position information corresponding to said test point when said test point is determined to tee capable of being inserted;

a test point index calculation portion for calculating an index expressing a degree of testability for a signal line capable of having a test point inserted therein and a test point type, assuming that said test point is inserted; and a test point determining portion for determining a set of a signal line and a test point type having a large testability as determined by said index expressing a degree of testability as a test point from among said obtained set of a signal line and a test point type for which a test point may be inserted.

12. A semiconductor integrated circuit, having cells, at least one of which has a large drivability, which cells are equipped in said semiconductor integrated circuit to reduce delays in signal lines, each of said signal lines, which have along distance or are connected to a plurality of branches, is used as a part composing a control point to be used for test point insertion.

13. A method of analyzing logic circuit test points, which method determines positions for inserting test points and circuit types by calculating a test cost when said test points are inserted in respective signal lines of a logic circuit formed by connecting a plurality of elements, said method comprising the steps of:

selecting a preset number of test point candidates in decreasing order of degree of testability obtained by calculating a test cost or an approximation value of a test cost for each of said signal lines in said logic circuit;

obtaining an effect region in which the testability varies when it is assumed that each of said test point candidates is inserted; and setting a group of candidates in said test point candidates, of which the effect regions do not overlap each other, or overlap each other with a negligible effect, as a new test point group of test points which are simultaneously testable.

14. A method of analyzing logic circuit test points, which method determines positions for inserting test points and circuit types by calculating a test cost when said test points are inserted in respective signal lines of a logic circuit formed by connecting a plurality of elements, said method comprising the steps of:

obtaining a test cost or an approximation value of a test cost for each of said signal lines in said logic circuit under the condition of non-execution or execution of inserting a test point for said signal line;

obtaining an effect region in which a testability varies when it is assumed that each of test point candidates is inserted, said test point candidates being determined by selecting a preset number of test points in decreasing order of degree of testability, based on said test cost obtained for each of said signal lines; and setting a group of candidates in said test point candidates, which are not included in effect regions of other groups in said test point candidates, as a new test point group of which the test points are simultaneously testable, by examining an effect region of each test point candidate in turn in the decreasing order of degree of testability.

15. A method of analyzing logic circuit test points, which method determines positions of inserting test points and circuit types by calculating a test cost when said test points are inserted in respective signal lines of a logic circuit formed by connecting a plurality of elements, said method comprising the steps of:

obtaining an approximation value of a test cost reduction (hereinafter, referred to as CRF) for each of said signal lines in said logic circuit under the condition of absence or presence of inserting a test point for said signal line;

selecting a preset number of test point candidates in decreasing order of CRF;

obtaining a test cost when it is assumed that each of said test point candidates is inserted;

determining presence or absence of an effect of each set test point to test costs of the other test point candidates when each of said test point candidates is set as a test point in turn in increasing order of test cost;

setting a test point candidate of which an effect on test costs of the other test point candidate does not exist or is negligible as a new test point group;

calculating effects of said set test point to the other test point candidates; and repeating the above processing steps.

16. A method of analyzing logic circuit test points according to claim 14, wherein if a predetermined completion condition is not satisfied when said setting process of said new test point group is executed over all of said preset number of test point candidates, based on presence or absence of effects of the test point effect, CRFs for said logic circuit including test points which were already set are re-calculated, further a necessary number of test point candidates are re-set in decreasing order of CRF, and said setting process of a new test point group considering effects of each of said re-set test point candidates is repeated.

17. A method of analyzing logic circuit test points according to claim 15, wherein every time CRF is re-calculated, updated group identifying information is added to a new test point group, and said group identifying information is given to each test point of said new test point group.

18. An apparatus for analyzing logic circuit test points which determines positions for inserting test points and circuit types by calculating a test cost when said test points are inserted in respective signal lines of a logic circuit formed by connecting a plurality of elements, said apparatus comprising:

a test point index calculation portion for obtaining a test cost or an approximation value of a test cost for each of said signal lines in said logic circuit under the condition of non-execution or execution of inserting a test point for said signal line, and selecting a preset number of test point candidates in decreasing order of degree of testability, based on an obtained test cost or an obtained approximation value of a test cost, for each of said signal lines in said logic circuit;

a test point effect calculation portion for calculating whether the testability of each of the other test point candidates is affected by a test point set just before; and a test point determining portion for repeating a process of setting a test point candidate having a highest degree of testability as a test point and a process of setting a test point candidate not having said effect between said test point candidate and said set test point as a next test point.

19. An apparatus for analyzing logic circuit test points according to claim 18, wherein said test point determining portion outputs test point correlation information for identifying test points, having effect regions, a degree of testability for each of signal lines in each of the said effect regions varying by setting a test point in said effect region, which do not intersect each other, are in the same group.

20. A semiconductor integrated circuit composed by inserting control points in a plurality of signal lines having relatively small test costs into a logic circuit formed by connecting a plurality of elements, wherein a test data input signal line of each of said control points, of which the effect regions, a degree of testability for each of signal lines in each of said effect regions varying by setting a control point in said effect region, do not intersect each other, is connected to a predetermined element, and said element is connected to any one of an external input element, a flip-flop with a scan function and a test data input signal line so as to be able to set a signal value.

21. A method of analyzing correlation information of test points in a logic circuit having a plurality of pre-set test points, said method comprising:

a first step of temporarily determining all test points to which a test point group is not set yet as test point candidates, based on circuit information including insertion positions of said test points, types of circuits and test costs, and determining a test point candidate having a minimum test cost as a test point;

a second step of calculating an effect region in which a test cost of each signal line varies by inserting said determined test point, and repeating a process of checking each of said test point candidates arranged in increasing order of test cost for whether or not it is included in said effect region, a process of determining a test point candidate which is not included in said effect region as a new test point, and a process of adding correlation information of the same group to said test point candidate determined as said new test point; and a third step of returning the processing to said first step if a predetermined number of test points cannot be determined as a new test point when said second step is performed over all of said test point candidates.

* * * * *